(12) United States Patent  
Suzuki

(10) Patent No.: US 9,071,781 B2  
(45) Date of Patent: Jun. 30, 2015

(54) IMAGE CAPTURING APPARATUS AND DEFECTIVE PIXEL DETECTION METHOD

(75) Inventor: Satoshi Suzuki, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 37 days.

(21) Appl. No.: 13/700,326

(22) PCT Filed: Mar. 21, 2012

(86) PCT No.: PCT/JP2012/058037
§ 371 (c)(1),
(2), (4) Date: Nov. 27, 2012

(87) PCT Pub. No.: WO2012/128391
PCT Pub. Date: Sep. 27, 2012

(65) Prior Publication Data
US 2013/0070129 A1 Mar. 21, 2013

(30) Foreign Application Priority Data

Mar. 24, 2011 (JP) .................. 2011-066553
Jan. 24, 2012 (JP) .................. 2012-012436

(51) Int. Cl.
*H04N 5/367* (2011.01)
*H01L 27/146* (2006.01)
*H04N 5/217* (2011.01)
*H04N 5/232* (2006.01)
*H04N 5/345* (2011.01)
*H04N 9/07* (2006.01)

(52) U.S. Cl.
CPC .......... *H04N 5/367* (2013.01); *H01L 27/14643* (2013.01); *H04N 5/2173* (2013.01); *H04N 5/23245* (2013.01); *H04N 5/3458* (2013.01); *H04N 9/07* (2013.01)

(58) Field of Classification Search
CPC ... H04N 5/2173; H04N 5/2176; H04N 5/367; H04N 5/3458; H04N 5/3745; H04N 5/37457; H04N 5/23245; H04N 9/07; H01L 27/14627; H01L 27/14641; H01L 27/14643
USPC .......................................... 348/246; 382/275
See application file for complete search history.

(56) References Cited

U.S. PATENT DOCUMENTS

| | | | |
|---|---|---|---|
| 2006/0017826 A1* | 1/2006 | Sekimoto et al. | 348/246 |
| 2009/0086063 A1* | 4/2009 | Suzuki et al. | 348/241 |
| 2010/0128152 A1* | 5/2010 | Hayasaka et al. | 348/280 |

FOREIGN PATENT DOCUMENTS

| | | |
|---|---|---|
| JP | 61-261974 A | 11/1986 |
| JP | 2003-244712 A | 8/2003 |
| JP | 2006-026234 A | 2/2006 |
| JP | 2007-325139 A | 12/2007 |
| JP | 2009-163229 A | 7/2009 |
| JP | 2010-154493 | 7/2010 |

* cited by examiner

*Primary Examiner* — Paul Berardesca
(74) *Attorney, Agent, or Firm* — Cowan, Liebowitz & Latman, P.C.

(57) ABSTRACT

An image capturing apparatus comprises: an image sensor including a plurality of pixels each having a microlens and a plurality of photoelectric conversion means, and defective pixel detection means for detecting defective photoelectric conversion means from among the plurality of photoelectric conversion means, wherein the defective pixel detection means determines defective photoelectric conversion means by comparing an output signal output from photoelectric conversion means of a subject, sequentially taken from the plurality of photoelectric conversion means, for detection with first signals from photoelectric conversion means included in pixels neighboring the pixel including the photoelectric conversion means of the subject for detection, each position of the photoelectric conversion means included in the neighboring pixels corresponding to a position of the photoelectric conversion means of the subject for detection with respect to the microlens.

15 Claims, 17 Drawing Sheets

DEFECTIVE PIXEL

F I G. 2
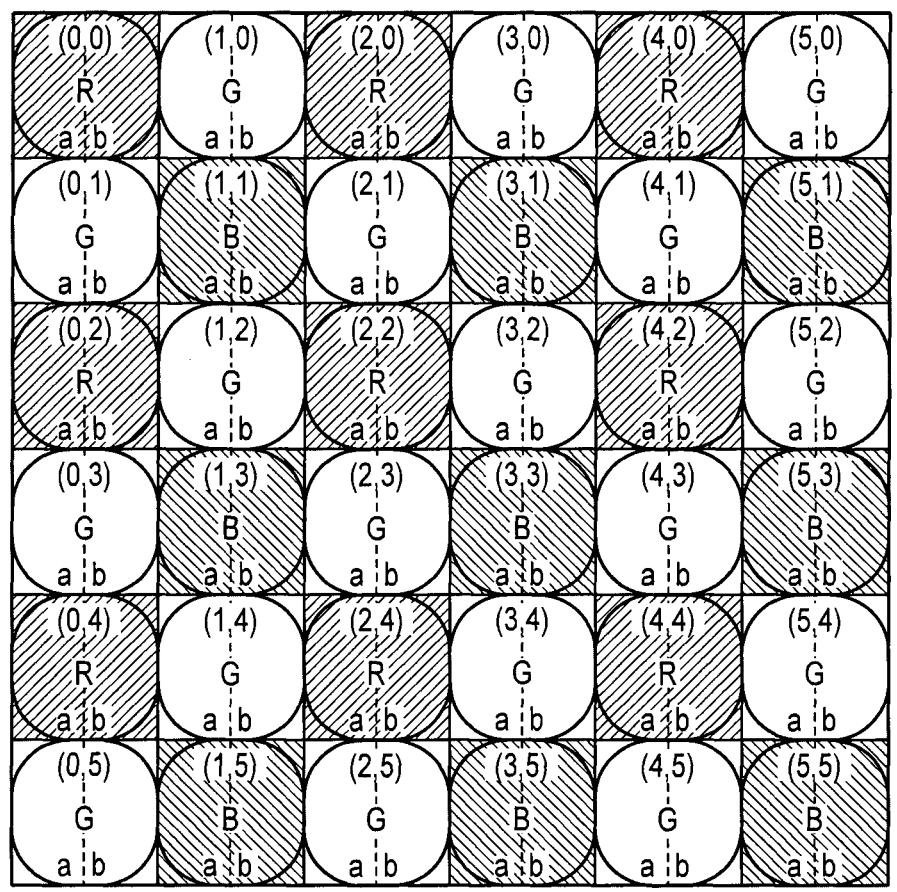

DEFECTIVE PIXEL

DEFECTIVE PIXEL

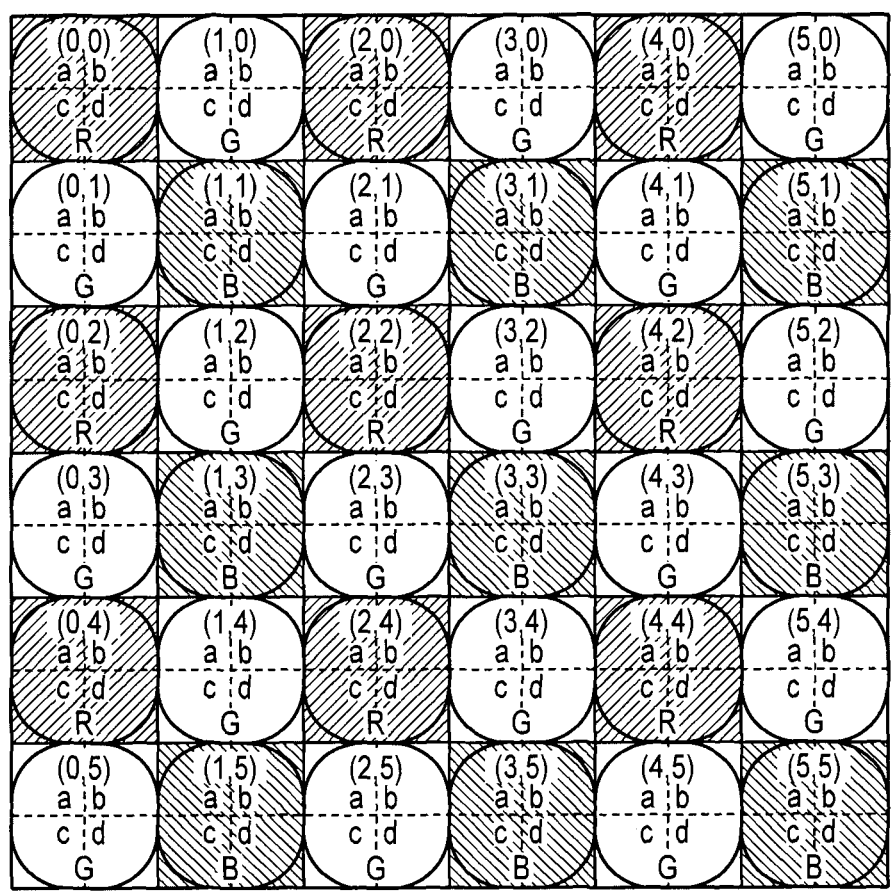
F I G. 10

F I G. 14
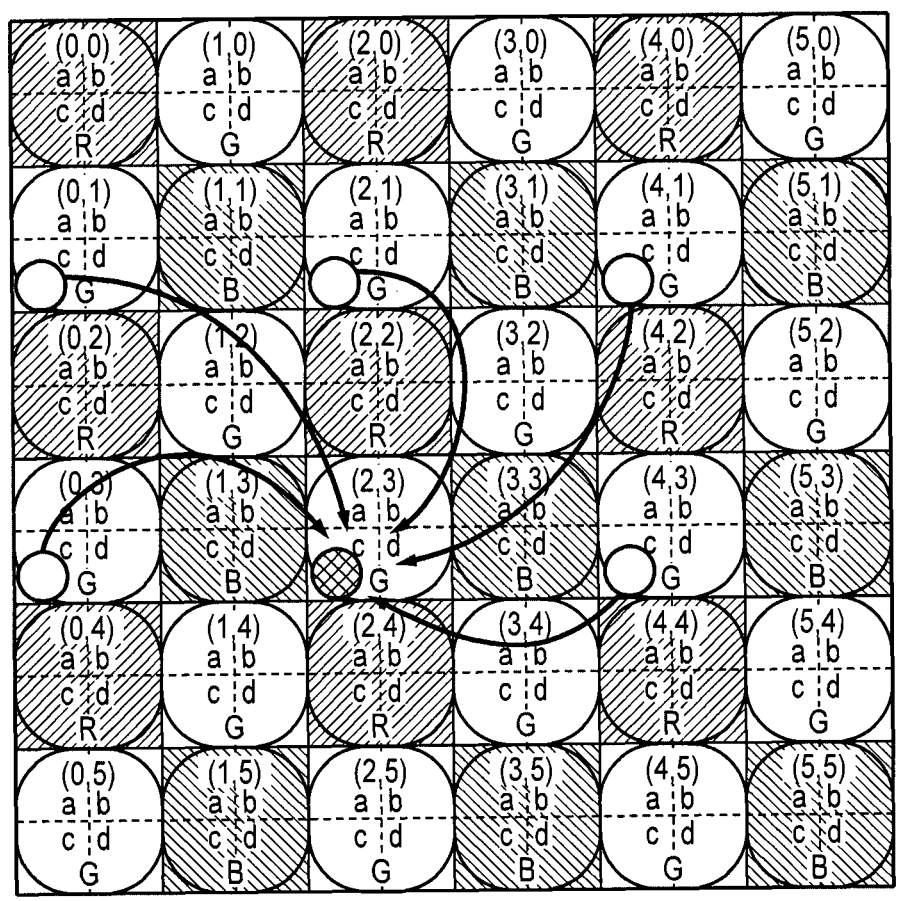

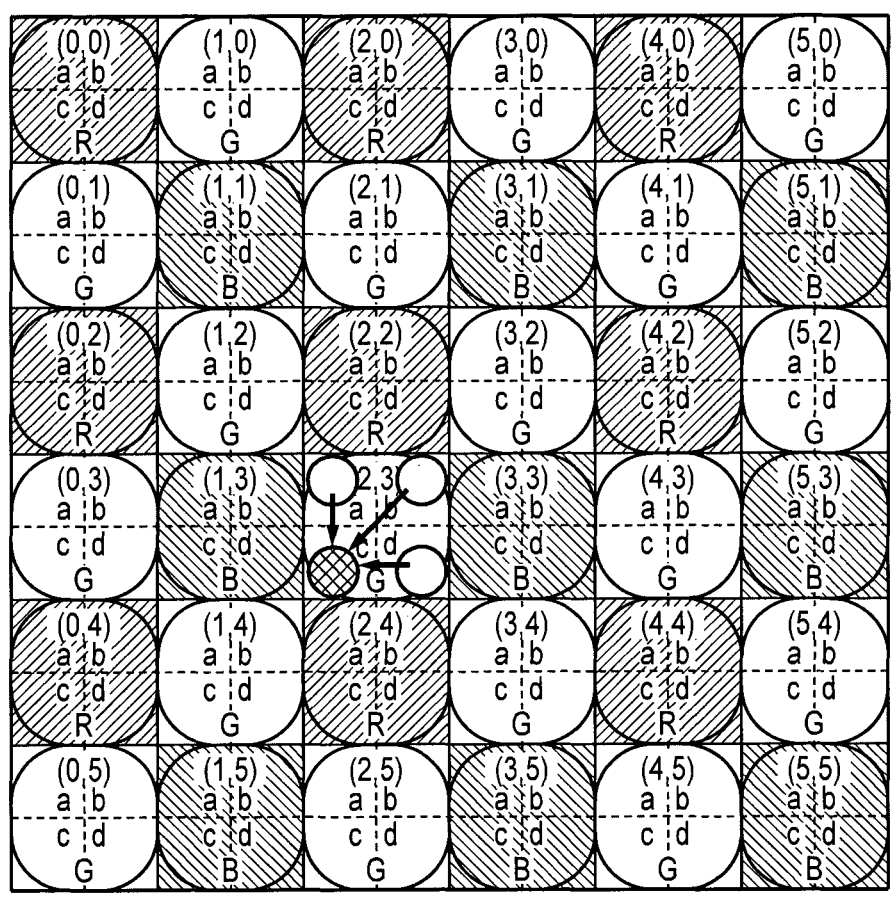
F I G. 16

IMAGE CAPTURING APPARATUS AND DEFECTIVE PIXEL DETECTION METHOD

CROSS-REFERENCE TO RELATED APPLICATIONS

This application is a national stage application of International Application No. PCT/JP2012/058037, filed Mar. 21, 2012, whose benefit is claimed and which claims the benefit of Japanese Patent Applications Nos. 2011-066553, filed Mar. 24, 2011 and 2012-012436, filed Jan. 24, 2012, the entire disclosures of which are incorporated herein by reference.

TECHNICAL FIELD

The present invention relates to an image capturing apparatus for capturing still images or moving images and a method for detecting a defective pixel, and in particular to a technique for detecting a defective pixel in the case where a photoelectric conversion unit in an image sensor, which is a constituent element of an image capturing apparatus, has a divided structure.

BACKGROUND ART

Conventionally, there are a number of image capturing apparatuses such as an electronic camera for recording and reproducing still images or moving images captured by a solid-state image sensor such as a CCD or CMOS image sensor.

As an example of techniques related to solid-state image sensors mounted on those image capturing apparatuses, Japanese Patent Laid-Open No. 2003-244712 and other publications propose a technique in which the photoelectric conversion units in all or some of the pixels constituting a solid-state image sensor are divided into several units (divided pixel). Applications of this kind of image sensors may include performing pupil division-type focus detection or generating stereoscopic images based on output signals independently obtained from the divided photoelectric conversion units. It is also possible to add the output signals from the divided photoelectric conversion units in each pixel and use the added signal as a normal image signal.

Incidentally, many recent electronic cameras are equipped with an image sensor having millions to tens of millions of pixels, while it is very difficult to manufacture an image sensor in which every pixel properly converts the incident light amount into electric signals. In practice, several "defective pixels" that do not work normally may exist among the pixels in the image sensor.

Therefore, in conventional image capturing apparatuses, corrections such as interpolation for a finally generated image are performed on an image signal corresponding to the position of such a defective pixel, using image signals from neighboring pixels of the defective pixel.

There are several methods for detecting a defective pixel to be a subject for correction. For example, in a manufacturing process of an image capturing apparatus or an image sensor, an address of a defective pixel detected based on a captured image may be recorded and stored in a memory in an image capturing apparatus.

Another detection method, which is proposed in Japanese Patent Laid-Open No. S61-261974 for example, is a real-time defective pixel detection method in which during each image capture by the image capturing apparatus it is determined whether or not a pixel that is the subject for detection is a defective pixel based on a level difference between an image signal from that pixel and an image signal from the neighboring pixels.

However, the above-mentioned defective pixel detection in a solid-state image capturing apparatus using an image sensor with divided pixels has the following problem; it is difficult to always accurately determine whether or not a pixel that is the subject for detection is a defective pixel or a normal pixel that outputs correct object information. Therefore, if a normal pixel is determined to be a defective pixel by error, there is also a risk of erroneous correction, resulting in the situation where an image signal based on actual incident light from an object is unnecessarily corrected. More specifically, output values obtained from a plurality of photoelectric conversion units in the above-described divided pixel are different from one another in a state where the object is not focused in the vicinity of the divided pixel. Accordingly, depending on the state of a photographing lens, a defective pixel may not be accurately detected with the defective pixel detection method in which whether or not a pixel that is the subject for detection is a defective pixel is determined by comparison with an output value from the neighboring pixels.

SUMMARY OF INVENTION

The present invention has been made in consideration of the above situation, and provides an image capturing apparatus using an image sensor having divided pixels and a detection method capable of improving the accuracy of defective pixel detection.

According to the present invention, provided is an image capturing apparatus comprising: an image sensor including a plurality of pixels each having a microlens and a plurality of photoelectric conversion units that share the microlens; and a defective pixel detection unit configured to detect photoelectric conversion units from among the plurality of photoelectric conversion units, the plurality of photoelectric conversion units being able to independently output image signals, wherein the defective pixel detection unit determines defective photoelectric conversion units using a first defective pixel detection method in which each of the plurality of photoelectric conversion units is sequentially taken as a subject for detection, and whether or not the photoelectric conversion unit of the subject for detection has a defect is determined, wherein in the first defective pixel detection method, the defective compares an output signal that is output from the photoelectric conversion unit of the subject for detection with first signals, and wherein the first signals are output from photoelectric conversion units included in pixels neighboring the pixel including the photoelectric conversion unit of the subject for detection, each position of each of the photoelectric conversion units included in the neighboring pixels corresponding to a position of the photoelectric conversion unit of the subject for detection with respect to the microlens.

According to the present invention, provided is a method for detecting a defective pixel in an image capturing apparatus including: an image sensor including a plurality of pixels each having a microlens and a plurality of photoelectric conversion units that share the microlens, the plurality of photoelectric conversion units being able to independently output image signals; and a defective pixel detection unit configured to photoelectric conversion units from among the plurality of photoelectric conversion units, the method comprising a step of sequentially taking each of the plurality of photoelectric conversion units as a subject for detection, and determining whether or not the photoelectric conversion unit of the subject for detection has a defect by comparing an output signal output from the photoelectric conversion unit of the subject for detection with first signals, wherein the first signals are output from photoelectric conversion units included in neighboring pixels of the pixel having the photoelectric conversion unit of the subject for detection, each position of each of the photoelectric conversion units included in the neighboring pixels corresponding to a position of the photoelectric conversion unit of the subject for detection with respect to the microlens.

Further features of the present invention will become apparent from the following description of exemplary embodiments (with reference to the attached drawings).

BRIEF DESCRIPTION OF DRAWINGS

The accompanying drawings, which are incorporated in and constitute a part of the specification, illustrate embodiments of the invention, and together with the description, serve to explain the principles of the invention.

FIG. 2 is a diagram depicting a pixel array in an image sensor according to the first embodiment;

FIG. 10 is a diagram depicting a pixel array in an image sensor according to the second embodiment;

FIG. 14 is a diagram for explaining a first defective pixel detection method according to the second embodiment;

FIG. 16 is a diagram for explaining a third defective pixel detection method according to the second embodiment.

DESCRIPTION OF EMBODIMENTS

Exemplary embodiments of the present invention will be described in detail in accordance with the accompanying drawings. The dimensions, shapes and relative positions of the constituent parts shown in the embodiments should be changed as convenient depending on various conditions and on the structure of the apparatus adapted to the invention, and the invention is not limited to the embodiments described herein.

First Embodiment

Firstly, a first embodiment of the present invention is described.

Figure 1:
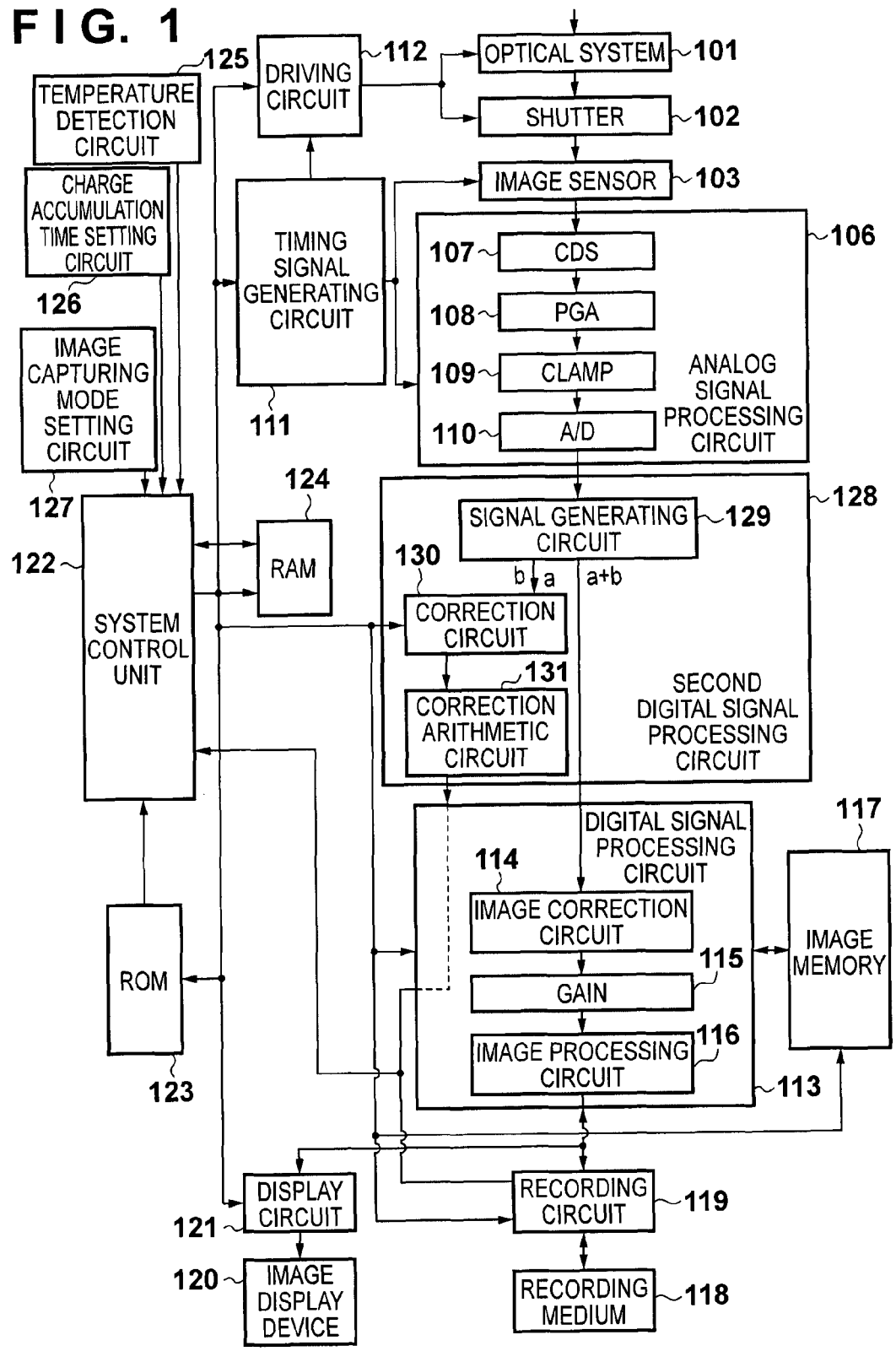
FIG. 1 is a block diagram showing an outline configuration of an image capturing apparatus according to a first embodiment of the present invention.

FIG. 1 is a block diagram showing an outline configuration of an image capturing apparatus according to the first embodiment.

Referring to FIG. 1, reference numeral 101 denotes an optical system including a photographing lens and a diaphragm, reference numeral 102 denotes a mechanical shutter, reference numeral 103 denotes an image sensor for converting incident light into an electric signal, the image sensor 103 including a photoelectric conversion unit for converting incident light into an electric signal and a signal amplifier circuit for amplifying the electric signal.

Reference numeral 106 denotes an analog signal processing circuit for performing analog signal processing on an image signal that is output from the image sensor 103. The analog signal processing circuit 106 includes a CDS circuit 107 for performing correlated double sampling, a signal amplifier 108 for amplifying an analog signal, a clamp circuit 109 for performing horizontal OB clamping, and an A/D converter 110 for converting an analog signal into a digital signal.

Reference numeral 111 denotes a timing signal generating circuit for generating a signal for actuating the image sensor 103 and the analog signal processing circuit 106, and reference numeral 112 denotes a driving circuit for the optical system 101 and the mechanical shutter 102. Reference numeral 128 denotes a second digital signal processing circuit for generating an image capturing signal and a distance measuring signal from an image signal converted into a digital signal by the A/D converter 110 and performing necessary digital signal processing, the second digital signal processing circuit 128 including a signal generating circuit 129, a correction circuit 130, and a correlation arithmetic circuit 131. The signal generating circuit 129 generates the image capturing signal and the distance measuring signal from a digital image signal. The correction circuit 130 performs various corrections on the distance measuring signal generated by the signal generating circuit 129, and the correlation arithmetic circuit 131 generates distance measuring data used in calculation of a distance to an object by performing correlation arithmetic operation on the distance measuring signal.

Reference numeral 113 denotes a digital signal processing circuit for performing digital signal processing necessary for the image capturing signal (image data) and the distance measuring data output from the second digital signal processing circuit 128. The digital signal processing circuit 113 includes an image correction circuit 114 for performing necessary corrections on the image data, a signal amplifier circuit 115 for amplifying a digital signal corrected by the image correction circuit 114, and an image processing circuit 116 for performing necessary image processing on the image data. The processing performed by the image correction circuit 114 and the image processing circuit 116 will be described later.

Reference numeral 117 denotes an image memory for storing processed image data, reference numeral 118 denotes a recording medium detachable from the image capturing apparatus, and reference numeral 119 denotes a recording circuit for recording the signal-processed image data on the recording medium 118. Reference numeral 120 denotes an image display device for displaying the signal-processed image data that has been subjected to the signal processing, and reference numeral 121 denotes a display circuit for displaying an image on the image display device 120.

Reference numeral 122 denotes a system control unit for controlling the entire image capturing apparatus. Reference numeral 123 denotes a nonvolatile memory (ROM) for storing a program in which a control method implemented by the system control unit 122 is written, control data such as parameters or tables used when implementing the program, and correction data of a defective pixel address or the like. Reference numeral 124 denotes a volatile memory (RAM) for transferring and storing the program, control data, and correction data stored in the nonvolatile memory 123, which are used by the system control unit 122 when controlling the image capturing apparatus.

Reference numeral 125 denotes a temperature detection circuit for detecting a temperature of the image sensor 103 and its peripheral circuits. Reference numeral 126 denotes a charge accumulation time setting circuit for setting a charge accumulation time of the image sensor 103, and reference numeral 127 denotes an image capturing mode setting circuit for setting imaging conditions such as an ISO sensitivity and switching between image capturing modes including still image capturing and moving image capturing.

The image capturing operation of the image capturing apparatus with the above configuration is hereinafter described. Prior to the image capturing operation such as when the system control unit 122 starts to operate at the time when, for example, the image capturing apparatus is turned on, the necessary program, control data, and correction data are transferred from the nonvolatile memory 123 to the volatile memory 124 and stored. Those program and data are used by the system control unit 122 when controlling the image capturing apparatus. If necessary, additional programs and data are transferred from the nonvolatile memory 123 to the volatile memory 124, or the system control unit 122 directly reads out and uses the data in the nonvolatile memory 123.

First, the optical system 101 activates, in response to a control signal from the system control unit 122, the diaphragm and the photographing lens to focus on the image sensor 103 an object image controlled to have an appropriate brightness. Next, in still image capturing, the mechanical shutter 102 is driven by a control signal from the system control unit 122 to shield the image sensor 103 from light in accordance with the operation of the image sensor 103, so that a necessary exposure time is given. At this time, if the image sensor 103 has an electronic shutter function, this function may be used together with the mechanical shutter 102 to secure the necessary exposure time. In moving image capturing, the mechanical shutter 102 is kept open in response to a control signal from the system control unit 122 such that the image sensor 103 is always exposed during the image capturing.

The image sensor 103 is driven by a drive pulse based on an operation pulse generated by the timing signal generating circuit 111 controlled by the system control unit 122. The photoelectric conversion unit converts an object image into an electric signal by photoelectric conversion, and the signal amplifier circuit amplifies the electric signal with an amplification factor set according to a quantity of the incident light and outputs it as an analog image signal.

Clock synchronization noise in the analog image signal output from the image sensor 103 is eliminated by the CDS circuit 107 in the analog signal processing circuit 106 with an operation pulse generated by the timing signal generating circuit 111 controlled by the system control unit 122. The analog image signal is then amplified by the signal amplifier 108 with an amplification factor set according to a quantity of incident light, clamped at a signal output from a horizontal OB area as a reference voltage by the clamp circuit 109 and converted into a digital image signal by the A/D converter 110.

Next, the digital image signal output from the analog signal processing circuit 106 is processed by the second digital signal processing circuit 128 controlled by the system control unit 122. First, the signal generating circuit 129 generates an image capturing signal and a distance measuring signal based on the digital image signal. The image capturing signal generated by the signal generating circuit 129 is output without being subjected to any process. Meanwhile, the distance measuring signal generated by the signal generating circuit 129 is subjected to various corrections such as flaw detection and flaw correction according to the present invention, as well as a smoothing process by the correction circuit 130, and then the correlation arithmetic circuit 131 generates distance measuring data by performing correlation arithmetic processing and outputs this distance measuring data.

Next, the image capturing signal output from the second digital signal processing circuit 128 is processed by the digital signal processing circuit 113 controlled by the system control unit 122. First, the image correction circuit 114 performs on the image capturing signal the flaw detection and flaw correction according to the present invention and various image corrections such as dark shading correction, and the signal amplifier circuit 115 amplifies the image capturing signal with an amplification factor set according to a quantity of incident light. Then the image processing circuit 116 performs various kinds of image processing such as color conversion, white balancing, gamma correction, resolution conversion, and image compression. At this time, the image memory 117 is used for temporarily storing a digital image signal in the process of image processing or storing image data that is a signal-processed digital image signal.

The image data that has been signal-processed by the digital signal processing circuit 113 and the image data stored in the image memory 117 are converted by the recording circuit 119 into data suitable for the recording medium 118 (for example, file system data with a hierarchical structure), and then recorded on the recording medium 118. Alternatively, the image data that has been subjected to resolution conversion by the digital signal processing circuit 113 is converted by the display circuit 121 into a signal suitable for the image display device 120 (for example, an NTSC analog signal) and then displayed on the image display device 120.

Here, the digital signal processing circuit 113 may output a digital image signal as image data to the image memory 117 and the recording circuit 119 without performing signal processing in response to a control signal from the system control unit 122. The digital signal processing circuit 113, when requested by the system control unit 122, also outputs to the system control unit 122 information on a digital image signal or image data generated in the process of signal processing. Examples of the information on image data include information such as a spatial frequency of an image, an average value in a specified area, and a data quantity of a compressed image, or information extracted therefrom. The recording circuit 119, when requested by the system control unit 122, also outputs information such as a type or available space of the recording medium 118 to the system control unit 122.

Next, a reproduction operation in the case where image data is recorded on the recording medium 118 is described. In response to a control signal from the system control unit 122, the recording circuit 119 reads out the image data from the recording medium 118. Similarly, in response to a control signal from the system control unit 122, the digital signal processing circuit 113 performs image expansion if the read image data is a compressed image and stores the image data in the image memory 117. The image data stored in the image memory 117 is subjected to resolution conversion by the digital signal processing circuit 113, converted by the display circuit 121 into a signal suitable for the image display device 120, and displayed on the image display device 120.

The distance measuring data output from the second digital signal processing circuit 128 is sent via the digital signal processing circuit 113 to the system control unit 122. The system control unit 122 calculates a distance to the object based on the distance measuring data, and based on the calculation result controls the driving circuit 112 to drive the optical system 101.

FIG. 2 is an arrangement plan depicting a pixel array in the image sensor 103 according to the first embodiment.

Referring to FIG. 2, each of the areas numbered as (0,0), (1,0), (0,1), and so on represents a single pixel in the image sensor 103, and each of these pixels is provided with a microlens. In each pixel, each area indicated by a reference mark "a" or "b" represents a photoelectric conversion unit, and the photoelectric conversion units in a single pixel share the microlens provided to the pixel. According to the first embodiment, an output obtained by adding the output signals from the photoelectric conversion units a and b included in each pixel in image sensor 103 is hereinafter referred to as "pixel output". Also, according to the first embodiment, each of the outputs from photoelectric conversion units a and b is referred to as "divided output". If the divided output is used as a focus detecting signal or a stereoscopic image generating signal or the like, the two signals of the divided outputs from both photoelectric conversion units a and b are used.

In the first embodiment as described with reference to FIG. 2, each pixel has two photoelectric conversion units in a 2×1 arrangement, and it is shown that the photoelectric conversion units with the same reference mark "a" or "b" in different pixels are located at the same positions with respect to the microlens in the respective pixels. The letter "R," "G," or "B" written on each pixel represents a hue of a color filter provided to the pixel.

Figure 3:
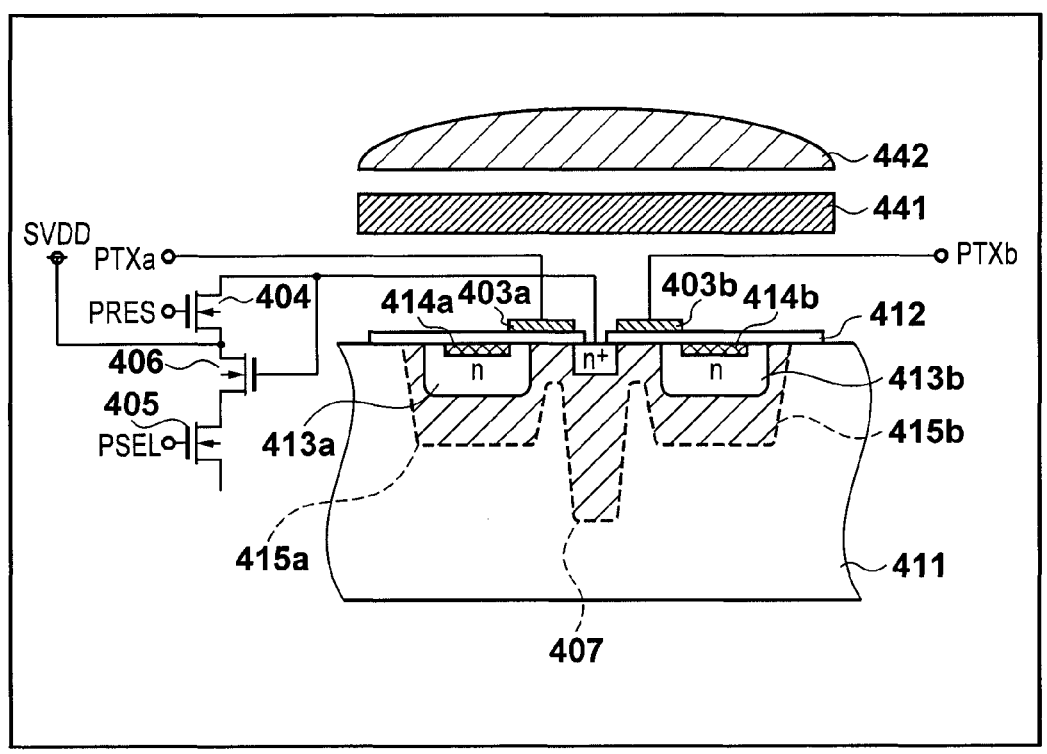
FIG. 3 is a diagram showing an outline cross section and a circuit configuration of a single pixel according to the first embodiment.

FIG. 3 is a diagram showing an outline cross section and a circuit configuration of a single pixel according to the first embodiment of the present invention. Referring to FIG. 3, reference numeral 411 denotes a p-type well, and reference numeral 412 denotes a gate insulating film formed with an SiO$_2$ film. Reference numerals 414a and 414b denote p+ layers formed on a surface of the p-type well 411, and together with n layers 413a and 413b form photoelectric conversion areas 415a and 415b. Reference numerals 403a and 403b denote transfer switches for transferring a signal charge generated in the photoelectric conversion areas 415a and 415b to a floating diffusion (FD) unit 407. Reference numeral 441 denotes a color filter, and reference numeral 442 denotes a microlens (on-chip lens). The microlens 442 is shaped and arranged such that a pupil of the photographing lens included in the optical system 101 and the photodiodes 402a and 402b in the image sensor 103 are approximately conjugate.

Figure 4:
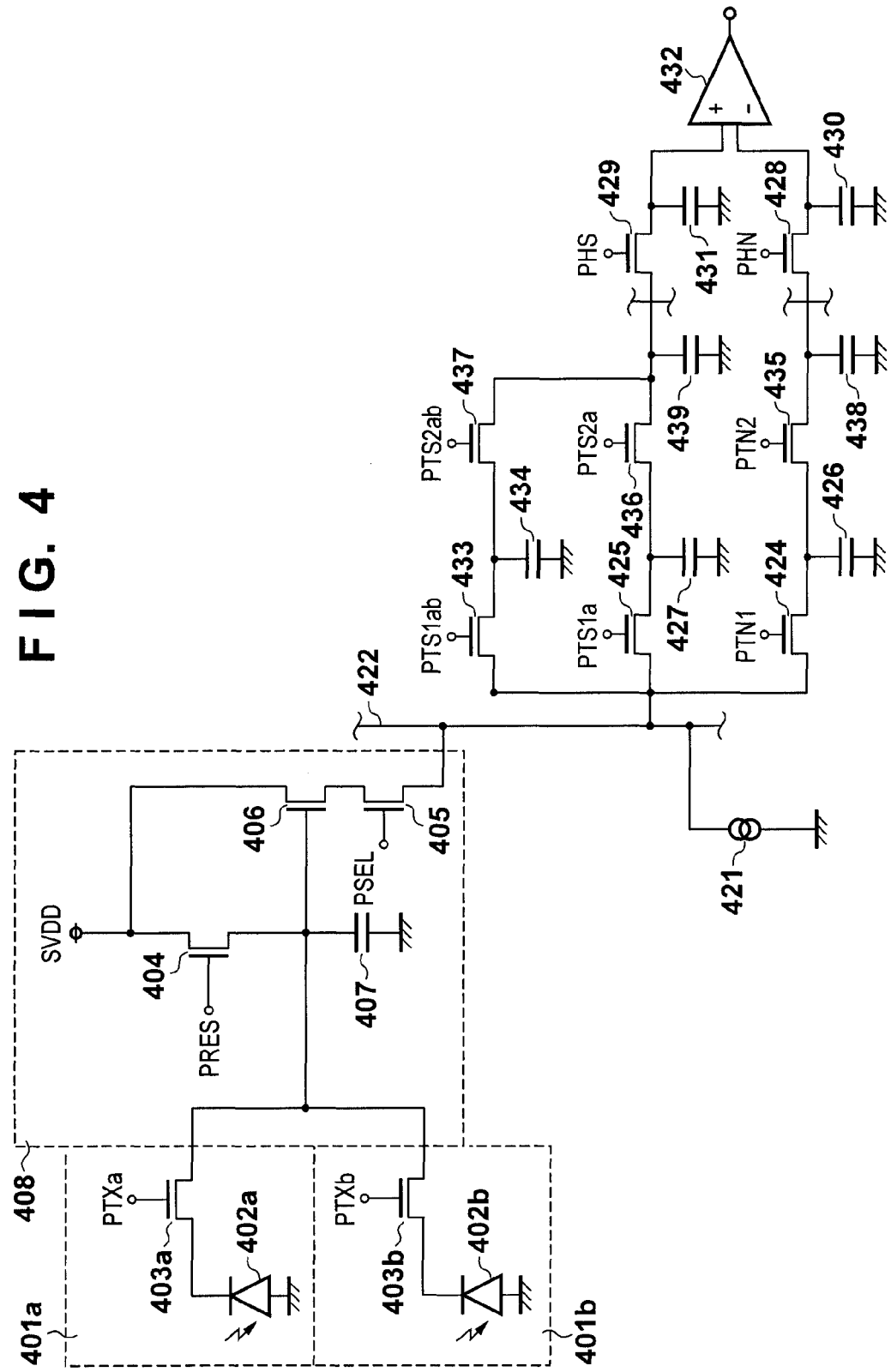
FIG. 4 is a circuit diagram depicting the configuration of the image sensor according to the first embodiment.

FIG. 4 is a circuit diagram depicting a CMOS image sensor as an example of a pixel unit in the image sensor 103 according to the first embodiment. As shown in FIG. 4, each pixel has two photoelectric conversion units 401a and 401b and a single pixel common unit 408.

The photoelectric conversion unit 401a includes a photodiode 402a that is a photoelectric conversion element, and a transfer switch 403a for transferring, with a pulse PTXa, an electric charge generated due to photoelectric conversion by the photodiode 402a. The photoelectric conversion unit 401b has the same configuration as the photoelectric conversion unit 401a.

The pixel common unit 408 includes an FD unit 407 for storing electric charges transferred by the transfer switches 403a and 403b in the photoelectric conversion units 401a and 401b respectively. In other words, a single FD unit 407 is connected to the two photoelectric conversion units 401a and 401b. The pixel common unit 408 also includes a reset switch 404 for resetting, with a reset pulse PRES, the FD unit 407 connected to a gate of a MOS transistor 406 to a potential SVDD. The pixel common unit 408 also includes a MOS transistor 406 for amplifying an electric charge stored in the FD unit 407 as a source follower, and a row selection switch 405 controlled with a selection pulse PSEL for selecting a row to be read by a vertical scanning circuit not shown in the figure.

In the configuration of the pixel unit in the image sensor 103 described above with reference to FIG. 4, any of the electric charges photoelectrically converted by the photodiodes 402a and 402b is transferred to the FD unit 407 by controlling the transfer switches 403a and 403b.

The electric charges in the pixels in the row selected by the row selection switch 405 are output to a vertical output line 422 by a source follower circuit formed with the row selection switch 405 and a load current source 421. The signal output pulse PTS1a turns on a transfer gate 425 to store a signal output to the vertical output line 422 in a transfer capacitance CTS1a 427. A signal output pulse PTS1ab turns on a transfer gate 433 and stores a signal output to the vertical output line 422 in a transfer capacitance CTS1ab 434. A noise output pulse PTN1 turns on the transfer gate 424 and stores a signal output to the vertical output line 422 in a transfer capacitance CTN1 426.

A signal transfer pulse PTS2a turns on a transfer gate 436 and stores the signal stored in the transfer capacitance CTS1a 427 in a transfer capacitance CTS2 439. A signal transfer pulse PTS2ab turns on a transfer gate 437 and also stores the signal stored in the transfer capacitance CTS1ab 434 in the transfer capacitance CTS2 439. A noise transfer pulse PNT2 turns on a transfer gate 435 and stores the signal stored in the transfer capacitance CTN1 426 in transfer capacitance CTN2 438.

Subsequently, in response to control signals PHS and PHN from a horizontal scanning circuit (not shown), a noise component is stored in a capacitance CHN 430 and a signal component is stored in a capacitance CHS 431 via transfer gates 428 and 429 respectively, and a difference between those components is output as a pixel signal by a differential amplifier 432.

In FIG. 4, the transfer gates 424, 425, 433, 435, 436, and 437 downstream of the vertical output line 422 are provided to each column. The section downstream of the transfer gates 428 and 429 is shared by plural columns, and the number of those sections is the same as the number of output terminals in the image sensor 103.

Figure 5:
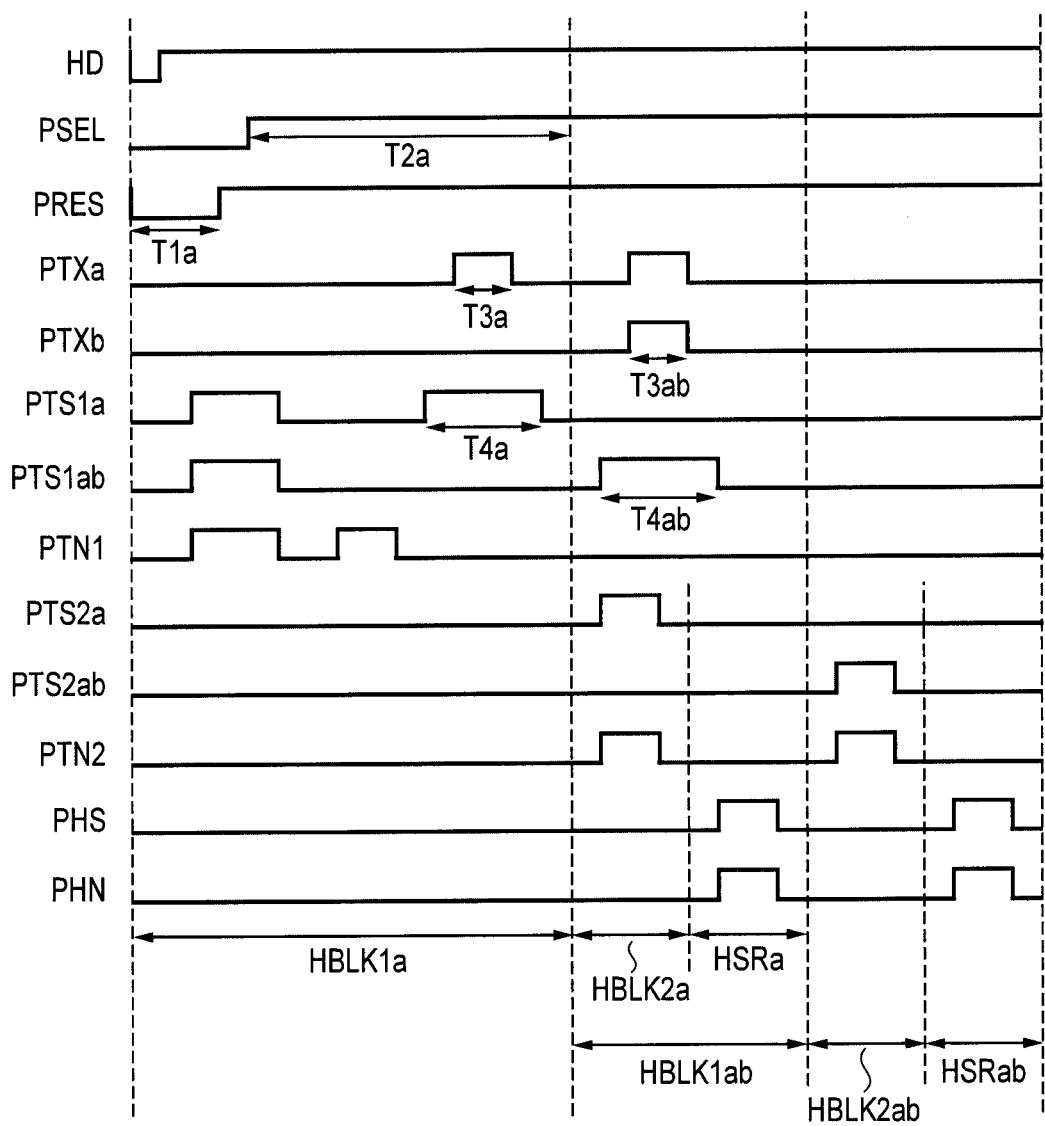
FIG. 5 is a timing chart showing a first drive timing according to the first embodiment.

FIG. 5 is a timing chart showing a drive timing (reading process) according to the first embodiment. The drive timing described with reference to FIG. 5 is a drive timing for sequentially reading a divided output signal a from the photoelectric conversion unit a and a pixel output signal ab obtained by adding the divided output signal a from the photoelectric conversion unit a and a divided output signal b from the photoelectric conversion unit b described with reference to FIG. 2. The drive timing is hereinafter described with reference to FIGS. 4 and 5.

First, a divided output signal from the photoelectric conversion unit 401a is read during periods HBLK1a, HBLK2a, and HSRa. As a trailing edge of a signal HD indicates the beginning of a single horizontal scanning period, the vertical output line 422 is reset to a fixed potential by a circuit (not shown). After that, by setting a PRES signal to a low (L) level and turning on the reset switch 404, during a period T1a the electric charge stored in the FD unit 407, which is applied to the gate of the MOS transistor 406, is reset to a fixed potential SVDD.

Subsequently, after setting the PRES signal to a high (H) level and turning off the MOS transistor 406, the source follower circuit formed with the row selection switch 405 and the load current source 421 becomes operative by setting the PSEL signal to the H level. Then a noise corresponding to the potential of the reset FD unit 407 is output via the MOS transistor 406 to the vertical output line 422. By setting the PTN signal to the H level during the period where this PSEL signal is at the H level, the transfer capacitance CTN1 426 that stores the noise component is connected to the vertical output line 422, and the transfer capacitance CTN1 426 is caused to hold a noise component signal.

Subsequently, a mixed signal of a photocharge generated in the photoelectric conversion element and a noise component is stored. First, the vertical output line 422 is reset to a fixed potential by a circuit (not shown). Then the PTXa signal is set to the H level, and a photocharge stored in the photodiode 402a is transferred to the FD unit 407 during a period T3a by turning on the transfer switch 403a. At this time, the PSEL signal is kept at the H level, so the source follower circuit is operative, and a "photo-signal+noise signal" corresponding to the potential of the FD unit 407 is output via the MOS transistor 406 to the vertical output line 422. By setting the PTS1a signal to the H level during a period T4a that includes the period T3a, the transfer capacitance CTS1a 427 that stores the "photocharge component+noise component" is connected to the vertical output line 422. Then the transfer capacitance CTS1a 427 is caused to hold the photocharge component+noise component signal.

As described above, a noise component and the photo-signal+noise component generated in the photodiode 402a for a single line are stored in the transfer capacitances CTN1 426 and CTS1a 427 respectively.

Next, during a period HBLK2a, the two signals stored in the transfer capacitances CTN1 426 and CTS1a 427 are transferred to capacitances CTN2 438 and CTS2 439 by control pulses PTN2 and PTS2a controlled by a horizontal shift register (not shown).

Next, during the period HSRa the two signals stored in the transfer capacitances CTN2 438 and CTS2 439 are transferred to the capacitances CHN 430 and CHS 431 with control pulses PHN and PHS controlled by a horizontal shift register (not shown) respectively. Then the noise signal and the photo-signal+noise component stored in the capacitances CHN 430 and CHS 431 are subjected to a process of subtracting the noise component from the (photo-signal+noise component) by the differential amplifier 432, thus a photo-signal is obtained and output as a divided output signal a.

During the period HBLK1ab, which corresponds to the combination of the periods HBLK2a and HSRa, control signals PTXa, PTXb, PRES, and PSEL are controlled and a pixel output signal ab obtained by adding the signals from the photoelectric conversion units 401a and 401b is read out.

First, the mixed signal of the photocharge and the noise component generated in the photoelectric conversion element is accumulated. The vertical output line 422 is reset to a fixed potential by a circuit (not shown). Then the PTXa signal and the PTXb signal are set to the H level, the photocharges accumulated in the photodiodes 402a and 402b are transferred to the FD unit 407 by turning on the transfer switches 403a and 403b during a period T3ab. At this time, the PSEL signal is kept at the H level, so the source follower circuit is operative, and the "photo-signal+noise signal" corresponding to the potential of the FD unit 407 is output via the MOS transistor 406 to the vertical output line 422. By setting the PTS1ab signal to the H level during a period T4ab that includes the period T3ab, a transfer capacitance CTS1ab 434 that stores the "photocharge component+noise component" is connected to the vertical output line 422, and then the transfer capacitance CTS1ab 434 is caused to hold a photocharge component+noise component signal.

As described above, the photo-signal+noise component generated in the photodiodes 402a and 402b is stored in the transfer capacitance CTS1ab 434.

Next, during a period HBLK 2ab, the two signals stored in the transfer capacitances CTN1 426 and CTS1ab 434 are transferred to the capacitances CTN2 438 and CTS2 439 with control pulses PTN2 and PTS2ab controlled by a horizontal shift register (not shown) respectively.

Next, during a period HSRa, the two signals stored in the transfer capacitances CTN2 438 and CTS2 439 are transferred to the capacitances CHN 430 and CHS 431 with control pulses PHN and PHS controlled by a horizontal shift register (not shown). The noise component and the photo-signal+noise component stored in the capacitances CHN 430 and CHS 431 is subjected to a process of subtracting the noise component from the (photo-signal+noise component) by the differential amplifier 432, thus a photo-signal is obtained and output as a pixel output signal ab.

With the above procedure, regarding the two photoelectric conversion units in a 2×1 arrangement, reading of the divided output signal from the photoelectric conversion unit 401a and the pixel output signal obtained by adding the divided output signal from the photoelectric conversion units 401a and the divided output signal from the photoelectric conversion unit 401b is finished.

Figure 6:
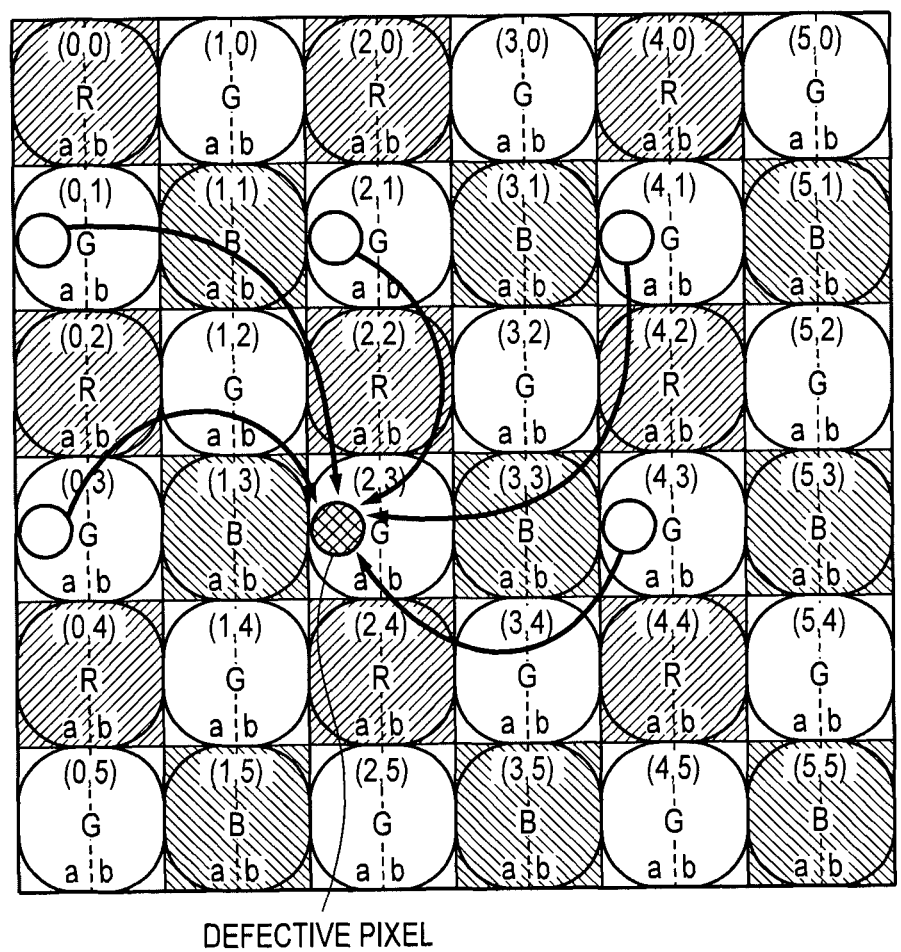
FIG. 6 is a diagram for explaining a first defective pixel detection method according to the first embodiment.

FIG. 6 is a diagram for explaining a first defective pixel detection method according to the first embodiment. The first defective pixel detection method is a method for detecting a defective pixel by comparing divided output values from photoelectric conversion units at the same location in a plurality of pixels of a single color.

Here, it is assumed for this description that the photoelectric conversion unit a in the pixel (2,3) shown in FIG. 2 is a subject for the defective pixel detection process. In this case, a divided output value of the photoelectric conversion unit a in the pixel (2,3) is compared with each of divided output values as first signals of photoelectric conversion units a in the pixels (0,1), (2,1), (4,1), (0,3) and (4,3), which are photoelectric conversion units on the same side in the neighboring pixels of the same color. As an example, an average value of the divided output values of the photoelectric conversion units a in the above-mentioned five neighboring pixels is compared with the divided output value of the photoelectric conversion unit a in the pixel (2,3), but the comparison method is not limited thereto and various other methods are conceivable. For instance, a divided output value of the photoelectric conversion unit a in the pixel (2,3) may be quintupled and compared to the sum of the divided output values of the photoelectric conversion units a in the five neighboring pixels. Alternatively, other methods, such as one in which a difference between the divided output value of the photoelectric conversion unit a in the pixel (2,3) and each of the divided output values of photoelectric conversion units a in the five neighboring pixels is obtained and thus obtained differences are added and/or averaged, may also be available.

If that difference is equal to or smaller than a predetermined first flaw detection threshold α, it is determined that the photoelectric conversion unit a in the pixel (2,3) to be the subject for detection is not a defective pixel. If the difference is larger than the first flaw detection threshold α, the photoelectric conversion unit a in the pixel (2,3) is determined to be a defective pixel and detected as a flawed pixel.

The photoelectric conversion units included in the image sensor 103 are subjected to detection in sequence and the above-described detection process is repeatedly performed on all photoelectric conversion units. However, the detection process does not have to be performed on photoelectric conversion units that are known in advance to have a defect.

The first defective pixel detection method is a detection method using a comparison between photoelectric conversion units at the same location with respect to the microlens, so detection can be done almost without any influence of a defocus amount for an object near the pixel of the subject for detection.

Figure 7:
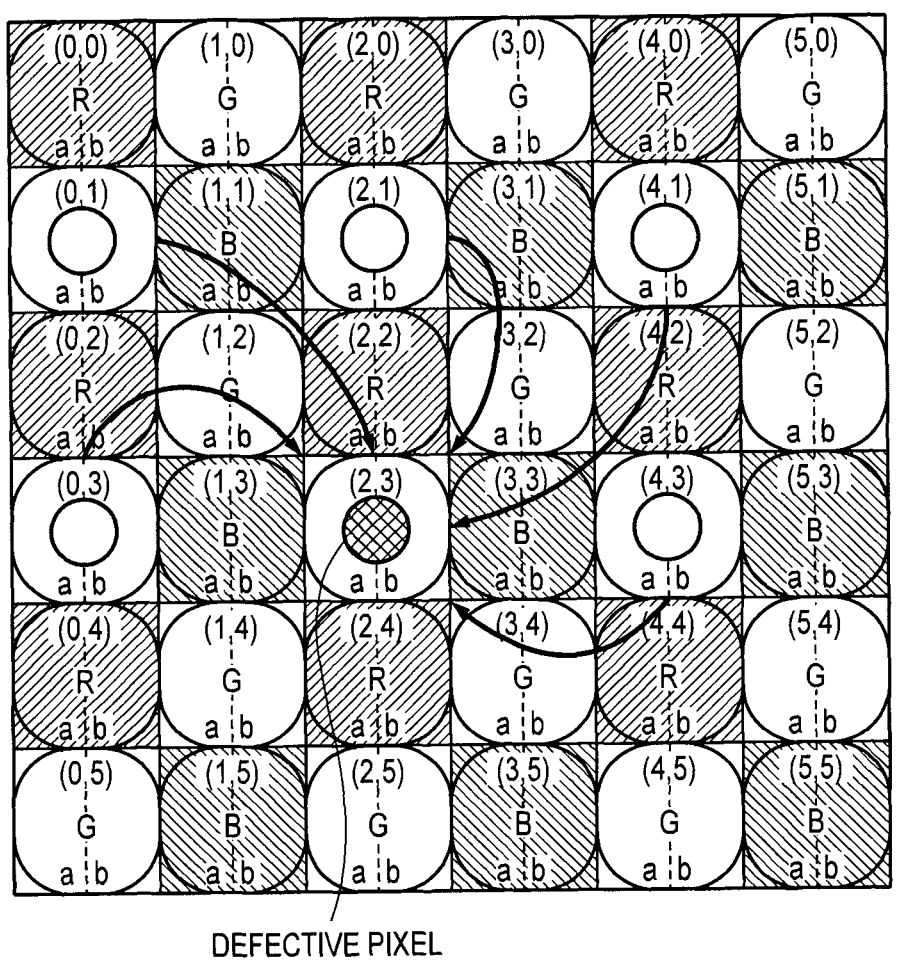
FIG. 7 is a diagram for explaining a second defective pixel detection method according to the first embodiment.

FIG. 7 is a diagram for explaining a second defective pixel detection method according to the first embodiment. The second defective pixel detection method is a method of detecting a defective pixel by comparing pixel output values in neighboring pixels.

In FIG. 7, it is assumed for this description that the pixel (2,3) shown in FIG. 2 is subjected to the defect detection process. In other words, in the second defective pixel detection method, divided signals of the photoelectric conversion units a and b in each pixel are added within this pixel and collectively output as a pixel output. For example, if the photoelectric conversion unit a in the pixel (2,3) is a defective pixel, the pixel (2,3) including this defect photoelectric conversion unit a can be detected as a defective pixel. In the second defective pixel detection method, a pixel output value of the pixel (2,3) is compared with pixel output values of pixels (0,1), (2,1), (4,1), (0,3), and (4,1), which are neighboring pixels of the same color. In this example, an average value of the above-listed five pixel output values is compared with the pixel output value of the pixel (2,3), but the comparison method is not limited thereto and various other methods are conceivable, as in the first defective pixel detection method.

If the difference is equal to or smaller than a predetermined second flaw detection threshold β, it is determined that the pixel (2,3) of the subject for detection is not a defective pixel. If the difference is larger than the second flow detection threshold β, the pixel (2,3) is determined to be a defective pixel and detected as a flawed pixel.

The pixels included in the image sensor 103 are subjected to detection in sequence and the above-described detection process is repeatedly performed on all those pixels. However, the detection process does not have to be performed on pixels that are known in advance to have a defect.

Figure 8:
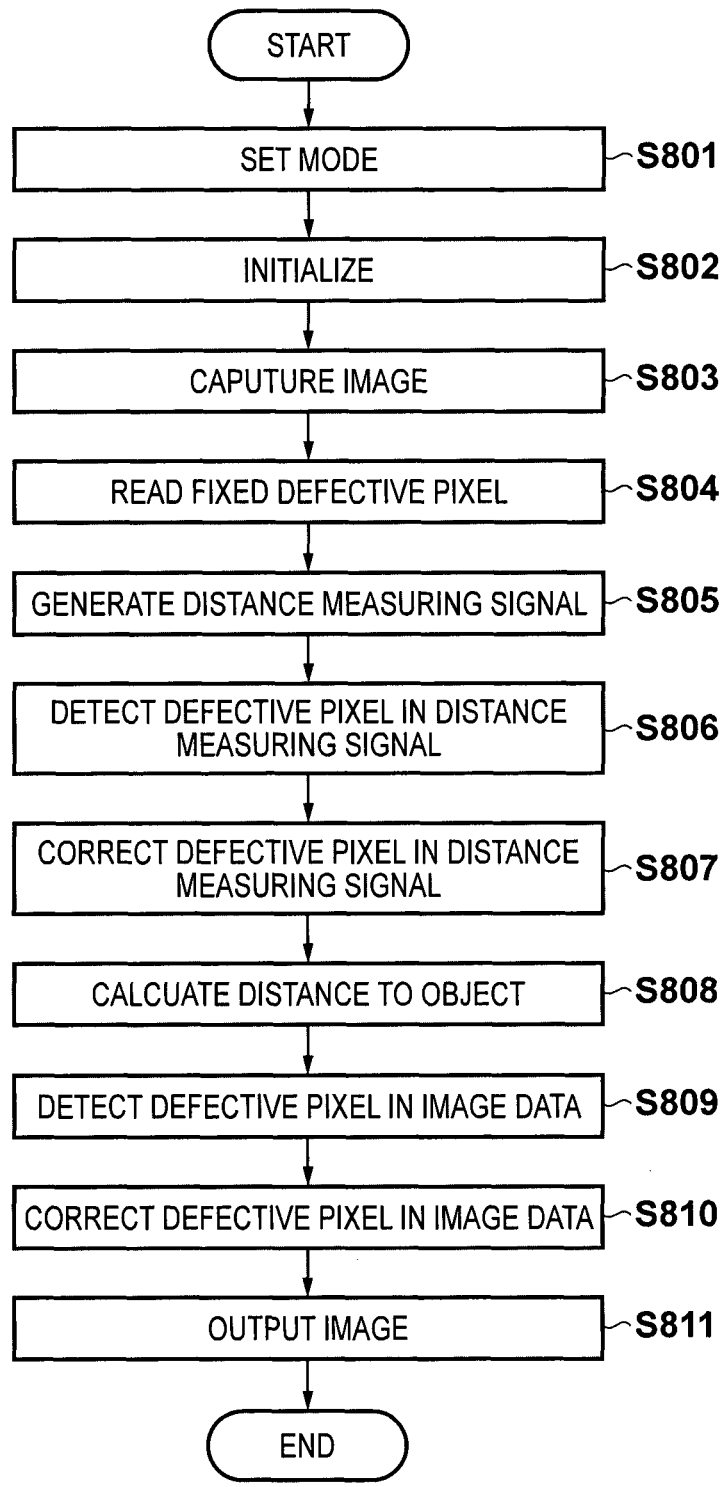
FIG. 8 is a flowchart showing a procedure of defective pixel correction according to the first embodiment.

FIG. 8 is a flowchart depicting an example of a defective pixel correction procedure according to the first embodiment.

Referring to FIG. 8, first, a mode such as still image capturing, moving image capturing, or stereoscopic images capturing is set by the image capturing mode setting circuit 127 (step S801), and shooting conditions such as sensitivity, diaphragm value, or exposure time are initialized according to the set mode (step S802). Subsequently the shutter 102 is controlled to expose the image sensor 103 (step S803).

Next, information on fixed defective pixels extracted in advance in the manufacturing process of the image capturing apparatus is read in from the nonvolatile memory 123 (step S804).

Next, a defective pixel detection is performed for a distance measuring signal by the second digital signal processing circuit 128. First, a distance measuring signal is generated by the signal generating circuit 129 (step S805). More specifically, a difference signal between a pixel output signal ab obtained by adding an output signal from the photoelectric conversion unit 401a and an output signal from the photoelectric conversion unit 401b and a divided output signal a from the photoelectric conversion unit 401a is generated as a divided output signal b from the photoelectric conversion unit 401b. Thus, the divided output signal b is generated and used as distance measuring signals together with the divided output signal a.

Subsequently, the defective pixel detection using the first defective pixel detection method described with reference to FIG. 6 is performed by the correction circuit 130 using the divided output signal a and the above generated divided output signal b (step S806). Then each of the distance measuring signals as well as the fixed defective pixels are subjected to corrections (step S807). After that, correlation arithmetic processing is performed on the distance measuring signal, that has undergone various corrections, by the correlation arithmetic circuit 131 and data of a distance to an object is calculated (step S808).

Next, a defective pixel detection for a captured picture is performed by the digital signal processing circuit 113. The defective pixel detection using the second defective pixel detection method described with reference to FIG. 7 is performed by the image correction circuit 114 (step S809), and each of the defective pixels as well as the fixed defective pixels are subjected to corrections (step S810).

Lastly, an image signal is output to the image memory 117, the recording circuit 119, or the display circuit 121 (step S811) and the image capturing is finished.

As described above, according to the first embodiment, the accuracy of defective pixel detection can be improved in an image capturing apparatus using an image sensor having a plurality of photoelectric conversion units.

Second Embodiment

Next, a second embodiment of the present invention is described.

Figure 9:
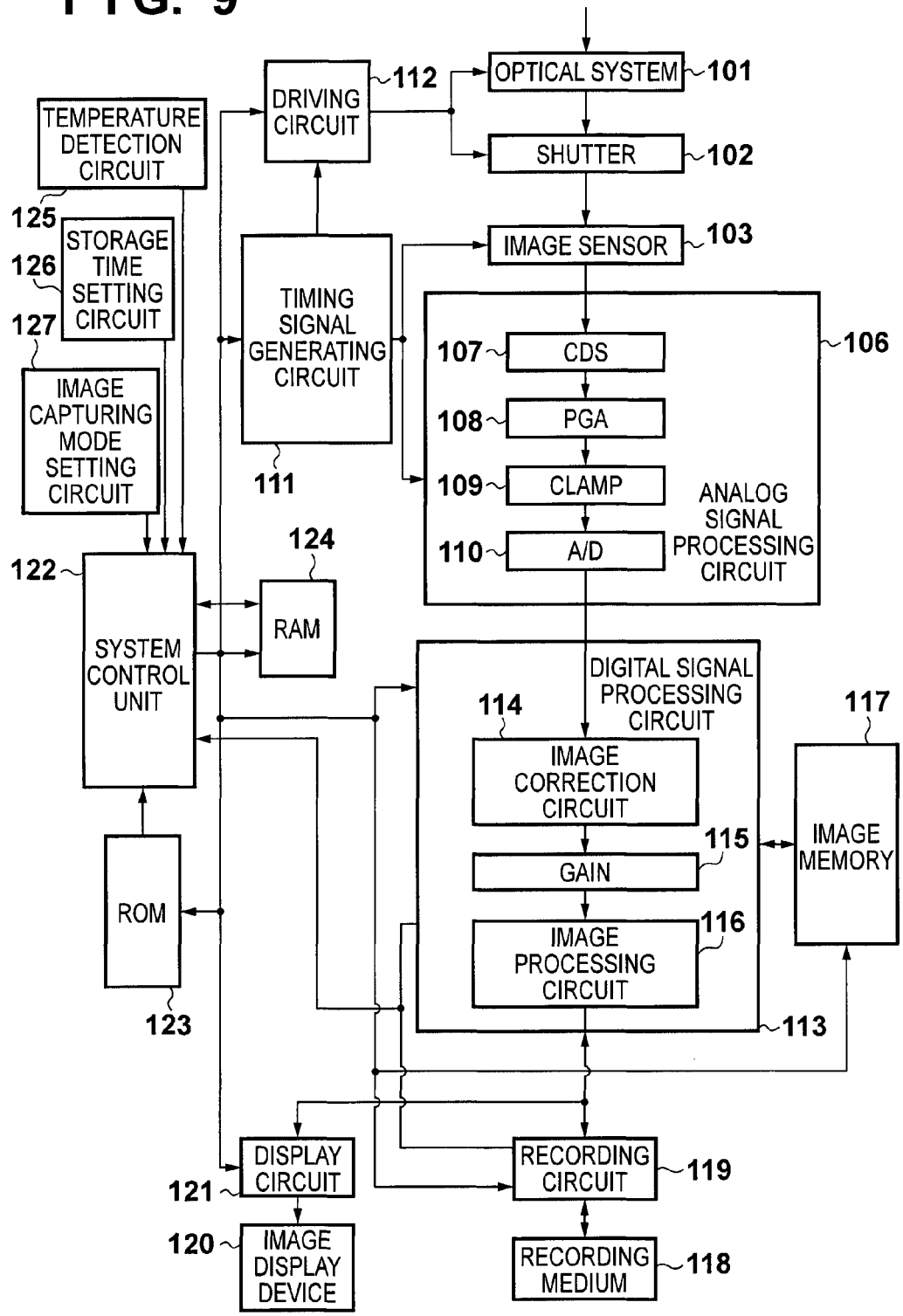
FIG. 9 is a block diagram showing an outline configuration of an image capturing apparatus according to a second embodiment of the present invention.

FIG. 9 is a diagram showing an outline configuration of an image capturing apparatus according to the second embodiment. The difference between the configurations shown in FIG. 9 and FIG. 1 is that the configuration in FIG. 9 does not include a second digital signal processing circuit 128. But the rest is the same as in FIG. 1, so the same reference numerals are given and a further description thereof is omitted.

Further, the image capturing operation of the image capturing apparatus in the second embodiment with the above configuration is the same as in the above-described first embodiment up until the point where a digital image signal is output from the analog signal processing circuit 106, so the process after this point is described.

A digital image signal output from the analog signal processing circuit 106 is processed by the digital signal processing circuit 113 controlled by the system control unit 122. First, the image signal converted into a digital signal is subjected to the flaw detection and flaw correction according to the present invention as well as various corrections such as dark shading correction by the image correction circuit 114, and is amplified by the signal amplifier circuit 115 with an amplification factor set according to a quantity of incident light. Further, various kinds of image processing including image processing such as color conversion, white balancing, and gamma correction, resolution conversion, and image compression are performed by the image processing circuit 116. At this time, the image memory 117 is used to temporarily store a digital image signal in the process of signal processing or store image data that is a signal-processed digital image signal.

The image data signal-processed by the digital signal processing circuit 113 and image data stored in the image memory 117 are converted by the recording circuit 119 into data suitable for the recording medium 118 (for example, file system data with a hierarchical structure), and stored in the recording medium 118. Alternatively, image data resolution-converted by the digital signal processing circuit 113 is converted by the display circuit 121 into a signal suitable for the image display device 120 (for example, an NTSC analog signal) and displayed on the image display device 120.

Here, the digital signal processing circuit 113 may output a digital image signal as image data to the image memory 117 and the recording circuit 119 without performing signal processing according to a control signal from the system control unit 122. The digital signal processing circuit 113, when requested by the system control unit 122, also outputs to the system control unit 122 information on a digital image signal and image data generated in the process of signal processing to the system control unit 122. Examples of the information on image data include a spatial frequency of the image, an average value in a specified area, and a data amount of a compressed image, or information extracted therefrom. Further, the recording circuit 119, when requested by the system control unit 122, outputs to the system control unit 122 information such as the type or available space of the recording medium 118 to the system control unit 122.

Next, a reproduction operation in the case where image data is stored in the recording medium 118 is described. The recording circuit 119 reads out the image data from the recording medium 118 in response to a control signal from the system control unit 122. Also in response to the control signal from the system control unit 122, the digital signal processing circuit 113 performs image expansion process if the read image data is a compressed image, and stores the image data in the image memory 117. The image data stored in the image memory 117, after being subjected to resolution conversion by the digital signal processing circuit 113, is converted by the display circuit 121 into a signal suitable for the image display device 120 and displayed on the image display device 120.

FIG. 10 is an arrangement plan depicting a pixel array in the image sensor 103 according to the second embodiment.

Referring to FIG. 10, each area numbered as (0,0), (1,0), (0,1), and so on represents a single pixel in the image sensor 103, and each pixel is provided with a microlens. In each pixel, each area indicated by reference mark "a," "b," "c," or "d" represents a photoelectric conversion unit, and the photoelectric conversion units in a single pixel share the microlens provided to the pixel. In the second embodiment, an output obtained by adding output signals from the photoelectric conversion units a to d included in each pixel in image sensor 103 is hereinafter referred to as "pixel output." Further, in the second embodiment, each of the outputs from photoelectric conversion units a to d that are not added in the image sensor 103 is referred to as a divided output. If the divided output is used as a focus detecting signal or a stereoscopic image generating signal, for example, the two signals of "a sum of divided outputs from the photoelectric conversion units a and c" and "a sum of divided outputs from the photoelectric conversion units b and d" are generated.

In the second embodiment as described with reference to FIG. 10, each pixel has four photoelectric conversion units in a 2×2 arrangement and it is shown that the photoelectric conversion units with the same reference mark "a," "b," "C," or "d" in different pixels are located at the same position with respect to the microlens in the respective pixels. The letter "R," "G," or "B" written on each pixel represents a hue of a color filter provided to the pixel.

Further, the outline cross section and the circuit configuration of a single pixel according to the second embodiment are the same as those described in FIG. 3. However, although two photoelectric conversion areas are shown in FIG. 3, in the second embodiment two more photoelectric conversion areas having the same configuration are included as shown in FIG. 10.

Figure 11:
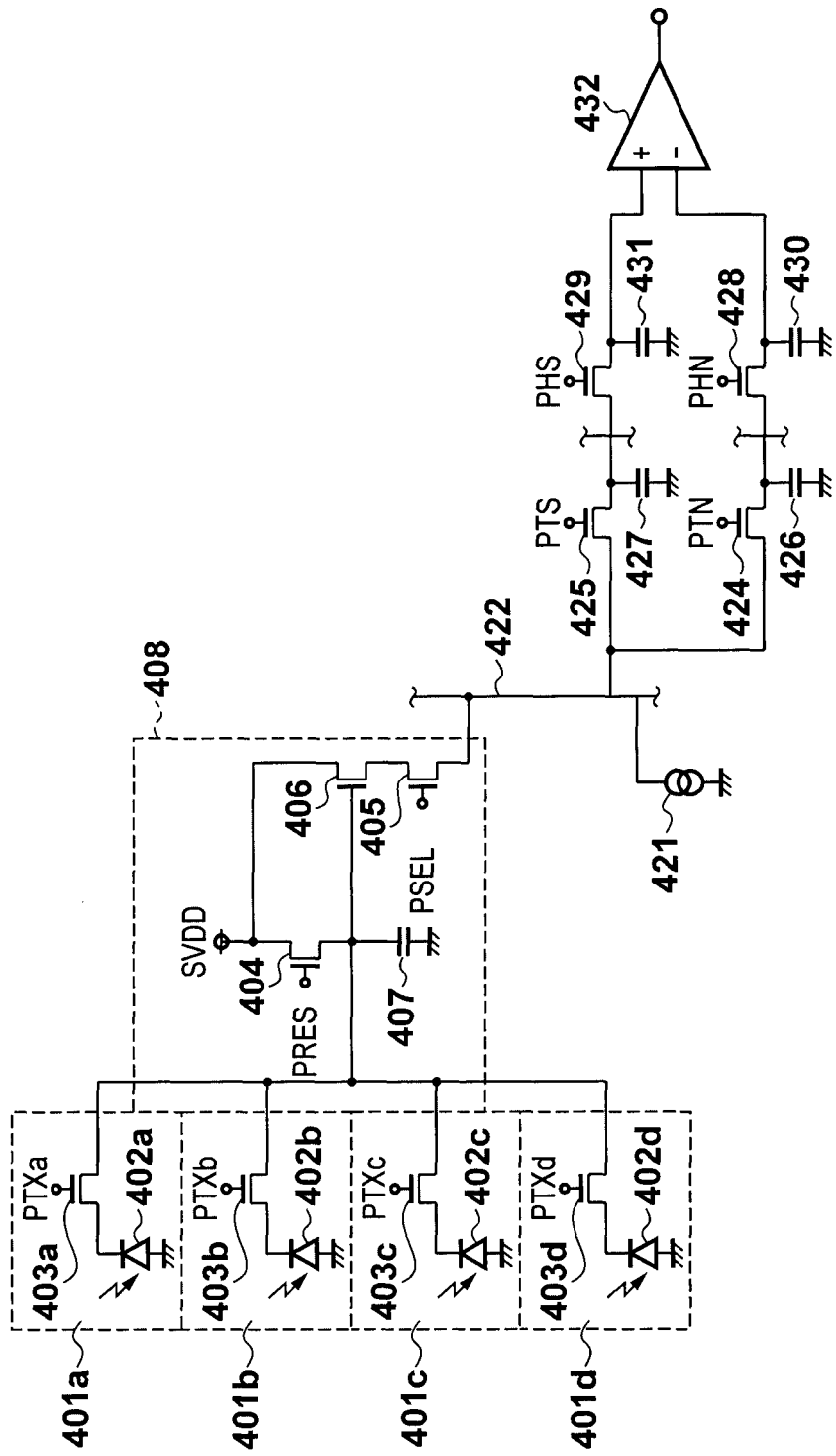
FIG. 11 is a circuit diagram depicting the configuration of the image sensor according to the second embodiment.

FIG. 11 is a circuit diagram depicting a CMOS image sensor as an example of a pixel unit in the image sensor 103 according to the second embodiment. As shown in FIG. 11, each pixel has four photoelectric conversion units 401a to 401d and a single pixel common unit 408.

The photoelectric conversion unit 401a includes a photodiode 402a that is a photoelectric conversion element, and a transfer switch 403a for transferring, with a pulse PTXa, an electric charge generated due to photoelectric conversion by the photodiode 402a. The photoelectric conversion units 401b to 401d have the same configuration as the photoelectric conversion unit 401a.

The pixel common unit 408 includes an FD unit 407 for storing the electric charge transferred by the transfer switches 403a to 403d in the photoelectric conversion units 401a to 401d. In other words, a single FD unit 407 is connected to the four photoelectric conversion units 401a to 401d. The pixel common unit 408 includes a reset switch 404 for resetting to a potential SVDD level, with a reset pulse PRES, the FD unit 407 connected to a gate of a MOS transistor 406. The pixel common unit 408 also includes a MOS transistor 406 for amplifying the charge stored in the FD unit 407 as a source follower and a row selection switch 405 controlled with a selection pulse PSEL for selecting a row to be read out by a vertical scanning circuit not shown in the figure.

In the configuration of the pixel unit in the image sensor 103 described with reference to FIG. 11, any of the electric charges photoelectrically converted by the photodiodes 402a to 402d are transferred to the FD unit 407 by controlling the transfer switches 403a to 403d.

The electric charges in the pixels in the row selected by the row selection switch 405 are output to a vertical output line 422 by a source follower circuit formed with a the selection switch 405 and a load current source 421. The signal output pulse PTS turns on a transfer gate 425 and stores the signal output to the vertical output line 422 in a transfer capacitance CTS 427, while a noise output pulse PTN turns on a transfer gate 424 and stores the signal output to the vertical output line 422 in a transfer capacitance CTN 426. Subsequently, in response to control signals PHS and PHN from a horizontal scanning circuit (not shown), a noise component is stored in a capacitance CHN 430 and a signal component is stored in a capacitance CHS 431 via transfer gates 428 and 429 respectively, and a difference therebetween is output as a pixel signal by a differential amplifier 432.

In FIG. 11, the transfer gates 424 and 425 downstream of the vertical output line 422 are provided in each row. The section downstream of the transfer gates 428 and 429 is shared by plural columns and, and the number of those sections is the same as the number of output terminals in the image sensor 103.

Figure 12:
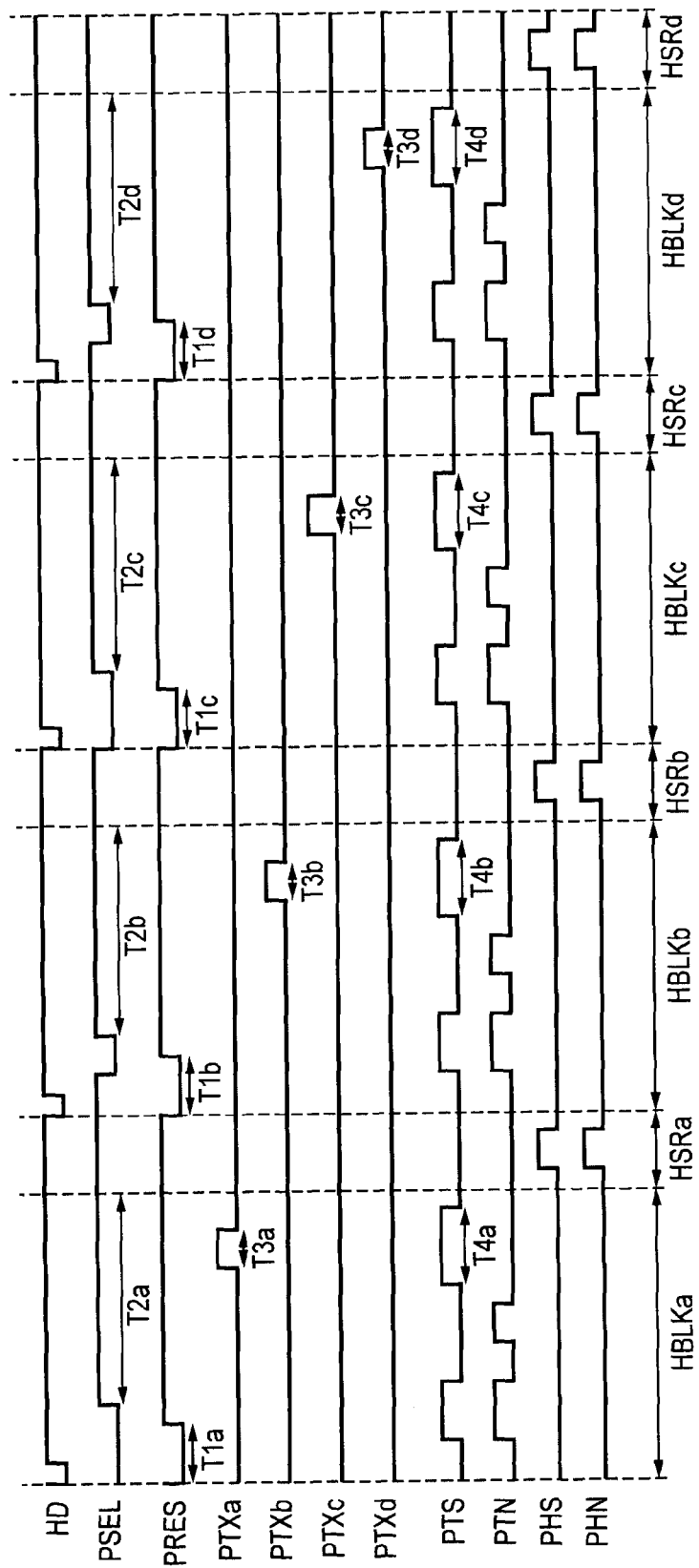
FIG. 12 is a timing chart showing a first drive timing according to the second embodiment.

FIG. 12 is a timing chart showing a first drive timing according to the second embodiment of the present invention. The first drive timing described with reference to FIG. 12 is a drive timing for independently reading out each of the divided output signals of the photoelectric conversion units a to d described with reference to FIG. 10. When signals are read out according to the first drive timing, it is possible to process divided output signals by the digital signal processing circuit 113 into a focus detecting signal or a stereoscopic image generating signal. In the driving described in the timing chart in FIG. 12, the photoelectric conversion units a, b, c, and d (i.e., the photoelectric conversion units 401a, 401b, 401c, and 401d in FIG. 11) are read out in this order. The first drive timing is hereinafter described with reference to FIGS. 11 and 12.

First, a signal from the photoelectric conversion unit 401a is read out during periods HBLKa and HSRa. As a trailing edge of a signal HD indicates the beginning of a single horizontal scanning period, the vertical output line 422 is reset to a fixed potential by a circuit (not shown). After that, by setting a PRES signal to a low (L) level and turning on the reset switch 404, during a period T1a the electric charge stored in the FD unit 407, which is applied to the gate of the MOS transistor 406, is reset to a fixed potential SVDD.

Subsequently, after setting the PRES signal to a high (H) level and turning off the MOS transistor 406, the source follower circuit formed with the row selection switch 405 and the load current source 421 becomes operative by setting the PSEL signal to the H level. Thus a noise corresponding to the potential in the reset FD unit 407 is output via the MOS transistor 406 to the vertical output line 422. By setting the PTN signal to the H level during a period where this PSEL signal is at the H level, the transfer capacitance CTN 426 that stores the noise component is connected to the vertical output line 422, and the transfer capacitance CTN 426 is caused to hold a noise component signal.

Subsequently, a mixed signal of a photocharge generated in the photoelectric conversion element and a noise component is stored. First, the vertical output line 422 is reset to a fixed potential by a circuit (not shown). Then the PTXa signal is set to the H level, and a photocharge stored in the photodiode 402a is transferred to the FD unit 407 during a period T3a by turning on the transfer switch 403a. At this time, the PSEL signal is kept at the H level, so the source follower circuit is operative, and a "photo-signal+noise signal" corresponding to the potential of the FD unit 407 is output via the MOS transistor 406 to the vertical output line 422. By setting the PTS signal to the H level during a period T4a that includes the period T3a, the transfer capacitance CTS 427 that stores the "photocharge component+noise component" is connected to the vertical output line 422, and the transfer capacitance CTS 427 is caused to hold the photocharge component+noise component signal.

As described above, a noise component and the photo-signal+noise component generated in the photodiode 402a for a single line are stored in the transfer capacitances CTN 426 and CTS 427 respectively.

Next, during a period HSRa, the two signals stored in the transfer capacitances CTN 426 and CTS 427 are transferred to capacitances CHN 430 and CHS 431 by control pulses PHN and PHS controlled by a horizontal shift register (not shown) respectively. Then the noise component and the photo-signal+noise component stored in the capacitances CHN 430 and CHS 431 respectively are subjected to a process of subtracting the noise component from the (photo-signal+noise component) by the differential amplifier 432, thus a photo-signal is obtained and output as a divided output signal.

Subsequently, during periods HBLKb and HSRb, the control signals PTXb, PRES, and PSEL are controlled to read out a signal from the photoelectric conversion unit 401b. The timing of reading out the signal of the photoelectric conversion unit 401b is the same as the above-described timing of reading out the signal of the photoelectric conversion unit 401a and so further description thereof is omitted.

During periods HBLKc and HSRc, control signals PTXc, PRES, and PSEL are similarly controlled to read out a signal of the photoelectric conversion unit 401c. During periods HBLKd and HSRd, control signals PTXd, PRES, and PSEL are similarly controlled to read out a signal from the photoelectric conversion unit 401d. With the above procedure, reading of the divided output signals from the four photoelectric conversion units 401a, 401b, 401c, and 401d in a 2×2 arrangement is finished.

Figure 13:
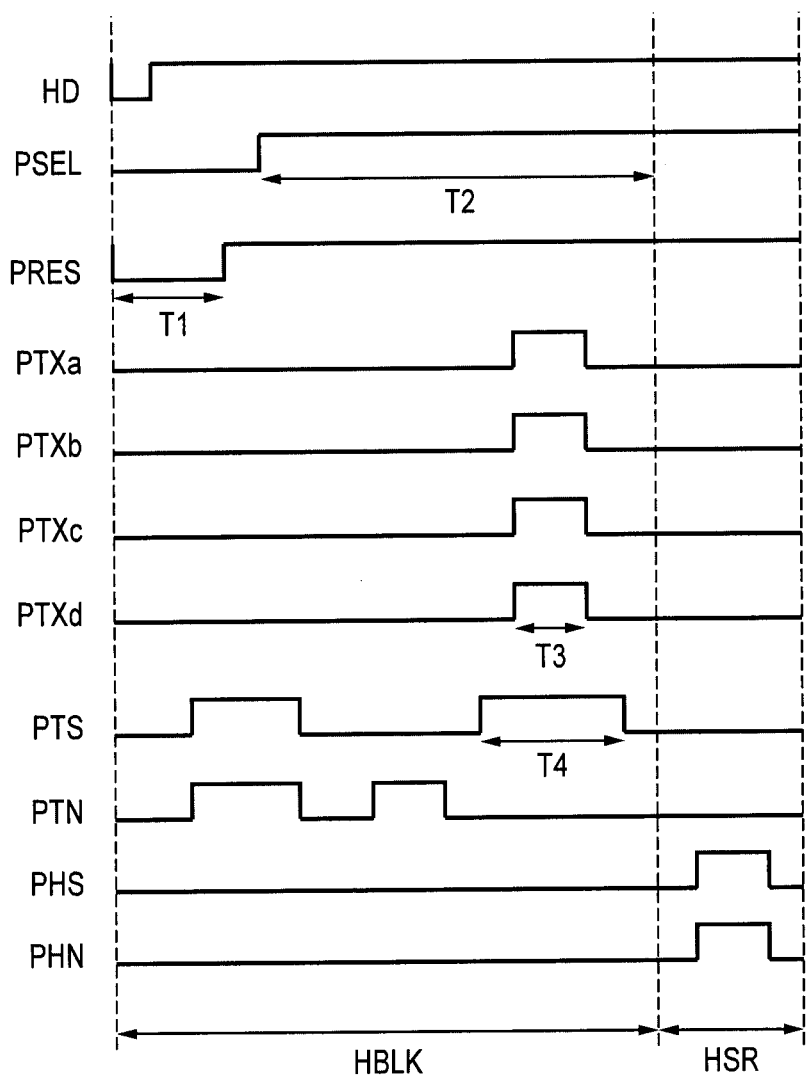
FIG. 13 is a timing chart showing a second drive timing according to the second embodiment.

FIG. 13 is a timing chart showing a second drive timing according to the second embodiment. The second drive timing described with reference to FIG. 13 is a drive timing for adding the signals from the photoelectric conversion units a to d included in each pixel described in FIG. 10 and collectively reading out the added signal as a pixel output signal of the pixel. When signals are read out according to the second drive timing in the case of normal image capturing such as still image capturing or moving image capturing where individual divided output signal are not necessary, signals can be rapidly read out. The second drive timing is hereinafter described with reference to FIGS. 11 and 13.

The drive timing in FIG. 13 is the same as the above-described first drive timing up until the point where the transfer capacitance CTN 426 is caused to hold the noise component signal by setting the PTN signal to the H level during a period where the PSEL signal is at the H level.

Subsequently, a mixed signal of the photocharge and the noise component generated in the photoelectric conversion element is stored. First, the vertical output line 422 is reset to a fixed potential by a circuit (not shown). After that, the signals PTXa, PTXb, PTXc, and PTXd are simultaneously set to the H level, and the transfer switches 403a to 403d are turned on, and the photocharges stored in the photodiodes 402a, 402b, 402c, and 402d are transferred to FD unit 407 during a period T3. At this time, the source follower circuit is operative because the PSEL signal is kept at the H level, and a "photo-signal+noise signal" according to a potential at the FD unit 407 is output via a MOS transistor 406 to the vertical output line 422. By setting the PTS signal to the H level during a period T4 that includes the period T3, the transfer capacitance CTS 427 that stores the "photocharge component+noise component" is connected to the vertical output line 422, and the transfer capacitance CTS 427 is caused to hold a photocharge component+noise component signal.

As described above, the noise component for a single line and the photo-signal+noise component generated in the photodiodes 402a to 402d are stored in the transfer capacitances CTN 426 and CTS 427 respectively.

Next, during a period HSR, the two signals stored in the transfer capacitances CTN 426 and CTS 427 are transferred to the capacitances CHN 430 and CHS 431 respectively with control pulses PHN and PHX controlled by a horizontal shift register (not shown). The noise component and the photo-signal+noise component stored in the capacitances CHN 430 and CHS 431 are subjected to a process of subtracting the noise component from the (photo-signal+noise component)

by the differential amplifier 432, and a photo-signal is thus obtained and output as a pixel output signal.

FIG. 14 is a diagram for explaining a first defective pixel detection method according to the second embodiment. The first defective pixel detection method is a method of detecting a defective pixel by comparing divided output values from the photoelectric conversion units located at the same position in different pixels of the same color.

In the following description, it is assumed that the photoelectric conversion unit c in the pixel (2,3) shown in FIG. 10 is a subject for defective pixel detection process. In this case, a divided output value of the photoelectric conversion unit c in pixel (2,3) is compared with each of the divided output values as first signals in the photoelectric conversion units c at the same quadrant in the pixels (0,1), (2,1), (4,1), (0,3) and (4,3) that are neighboring pixels of the same color. Here, as an example, an average value of the above-mentioned divided output values of the photoelectric conversion units c in the five neighboring pixels is compared with the divided output value of the photoelectric conversion unit c in the pixel (2,3), but the comparison method is not limited thereto and various other methods are conceivable. For example, the divided output value of the photoelectric conversion unit c in the pixel (2,3) may be quintupled and compared with a sum of the divided output values of the photoelectric conversion units c in the five neighboring pixels. Alternatively, other methods, such as one where a difference between the divided output value of the photoelectric conversion unit c in the pixel (2,3) and each of the divided output values of the photoelectric conversion units c in the five neighboring pixels is calculated and those differences are added and/or averaged, may also be available.

If the difference is equal to or smaller than a predetermined first flaw detection threshold $\alpha$, it is determined that the photoelectric conversion unit c in the pixel (2,3) of the subject for detection is not a defective pixel. If the difference is larger than the first flaw detection threshold $\alpha$, the photoelectric conversion unit c in the pixel (2,3) is determined to be a defective pixel and detected as a flawed pixel.

The photoelectric conversion units included in the image sensor 103 become the subject for detection in sequence and the above-described detection process is repeatedly performed on all those photoelectric conversion units. However, the detection process does not have to be performed on photoelectric conversion units that are known in advance to have a defect.

The first defective pixel detection method is a detection method using the comparison between the photoelectric conversion units located at the same position with respect to the microlens, so detection can be done almost without any influence of a defocus amount for an object near the pixel of the subject for detection.

FIG. 16 is a diagram for explaining a third defective pixel detection method according to the second embodiment. The third defective pixel detection method is a method of detecting a defective pixel by comparing divided output values from a plurality of the photoelectric conversion units included in a single pixel.

In FIG. 16 too, it is assumed for this description that the photoelectric conversion unit c in the pixel (2,3) shown in FIG. 10 is a subject for defect detection process. In this case, the divided output value of the photoelectric conversion unit c in the pixel (2,3) is compared with the divided output values of other photoelectric conversion units a, b, and d in the same pixel (2,3). Here, as an example, an average value of the above-mentioned divided output values of the three photoelectric conversion units a, b, and d is compared with the divided output value of the photoelectric conversion unit c in the pixel (2,3), but the comparison method is not limited thereto and various other methods is conceivable as in the above-described first defective pixel detection method.

If the difference is equal to or smaller than a predetermined third flaw detection threshold $\gamma$, it is determined that the photoelectric conversion unit c in the pixel (2,3) of the subject for detection is not a defective pixel. If the difference is larger than the third flaw detection threshold $\gamma$, the photoelectric conversion unit c in the pixel (2,3) is determined to be a defective pixel and detected as a flaw pixel.

The photoelectric conversion units included in the image sensor 103 become the subject for detection in sequence and the above-described detection process is repeatedly performed on all those photoelectric conversion units. However, the detection process does not have to be performed on photoelectric conversion units that are known in advance to have a defect.

The third defective pixel detection method is a detection method based on comparison between the photoelectric conversion units in a single pixel, so detection can be accurately performed even if an object around the pixel including the photoelectric conversion unit of the subject for detection has a high-frequency component. However, the third defective pixel detection method has the following problem. Specifically, if a photographing lens is focused on an object near the pixel including the photoelectric conversion unit of the subject for detection, the divided output values of the photoelectric conversion units in this pixel, or under the same microlens, become close to one another. However, as the defocus amount becomes larger, the divided output values of the photoelectric conversion units under the same microlens vary depending on a luminance distribution of the object. Accordingly, the defocus amount around the pixel of the subject for detection is first detected, then the third flaw detection threshold $\gamma$ is set to a predetermined value larger than the first flaw detection threshold $\alpha$ if the defocus amount is larger than a specific value. If the defocus amount is equal to or smaller than this preset value, the third flaw detection threshold $\gamma$ is set to another predetermined value smaller than the first flaw detection threshold $\alpha$. The third flaw detection threshold $\gamma$ may also be set to be smaller as the defocus amount is smaller.

Figure 15:
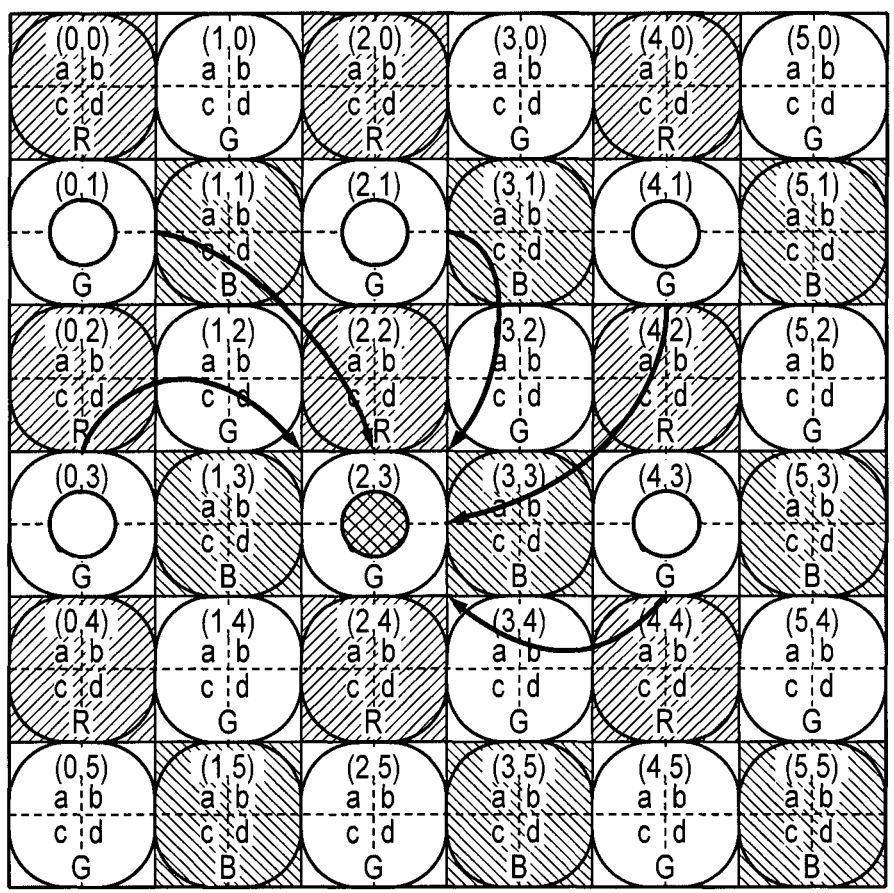
FIG. 15 is a diagram for explaining a second defective pixel detection method according to the second embodiment.

FIG. 15 is a diagram for explaining a second defective pixel detection method according to the second embodiment. This second defective pixel detection method is a method of detecting a defective pixel by comparing pixel output values of neighboring pixels.

In FIG. 15, it is assumed for this description that the pixel (2,3) shown in FIG. 10 is a subject for defect detection process. Specifically, the second defective pixel detection method is a detection method where divided signals from the photoelectric conversion units a, b, c, and d in a single pixel are added and collectively read out as a pixel output. For example, if the photoelectric conversion unit c in the pixel (2,3) is a defective pixel, the pixel (2,3) that includes the photoelectric conversion unit c of a defective pixel can be detected as a defective pixel. In the second defective pixel detection method, the pixel output value of the pixel (2,3) is compared with each of the pixel output values of pixels (0,1), (2,1), (4,1), (0,3), and (4,3) that are neighboring pixels of the same color. In this example an average value of the above-mentioned pixel output values of the pixels is compared with the pixel output value of the pixel (2,3), but the comparison method is not limited thereto and various other methods is conceivable as in the above-described first defective pixel detection method.

If the difference is equal to or smaller than a predetermined second flaw detection threshold β, it is determined that the pixel (2,3) of a subject for detection is not a defective pixel. If the difference is larger than the second flaw detection threshold β, the pixel (2,3) is determined to be a defective pixel and detected as a flawed pixel.

The pixels included in the image sensor 103 become the subject for detection in sequence and the above-described detection process is repeatedly performed on all those pixels. However, the detection process does not have to be performed on pixels that are known in advance to have a defect.

The second defective pixel detection method is available when it is desired to rapidly read out pixel output signals such as in moving image capturing, or in still image capturing. This second defective pixel detection method reads out a value obtained by adding divided output values of the photoelectric conversion units in each pixel, so defect in each photoelectric conversion unit cannot be detected. Therefore the second defective pixel detection method is not suitable for focus detection or stereoscopic images generation where individual divided output values are used.

Figure 17:
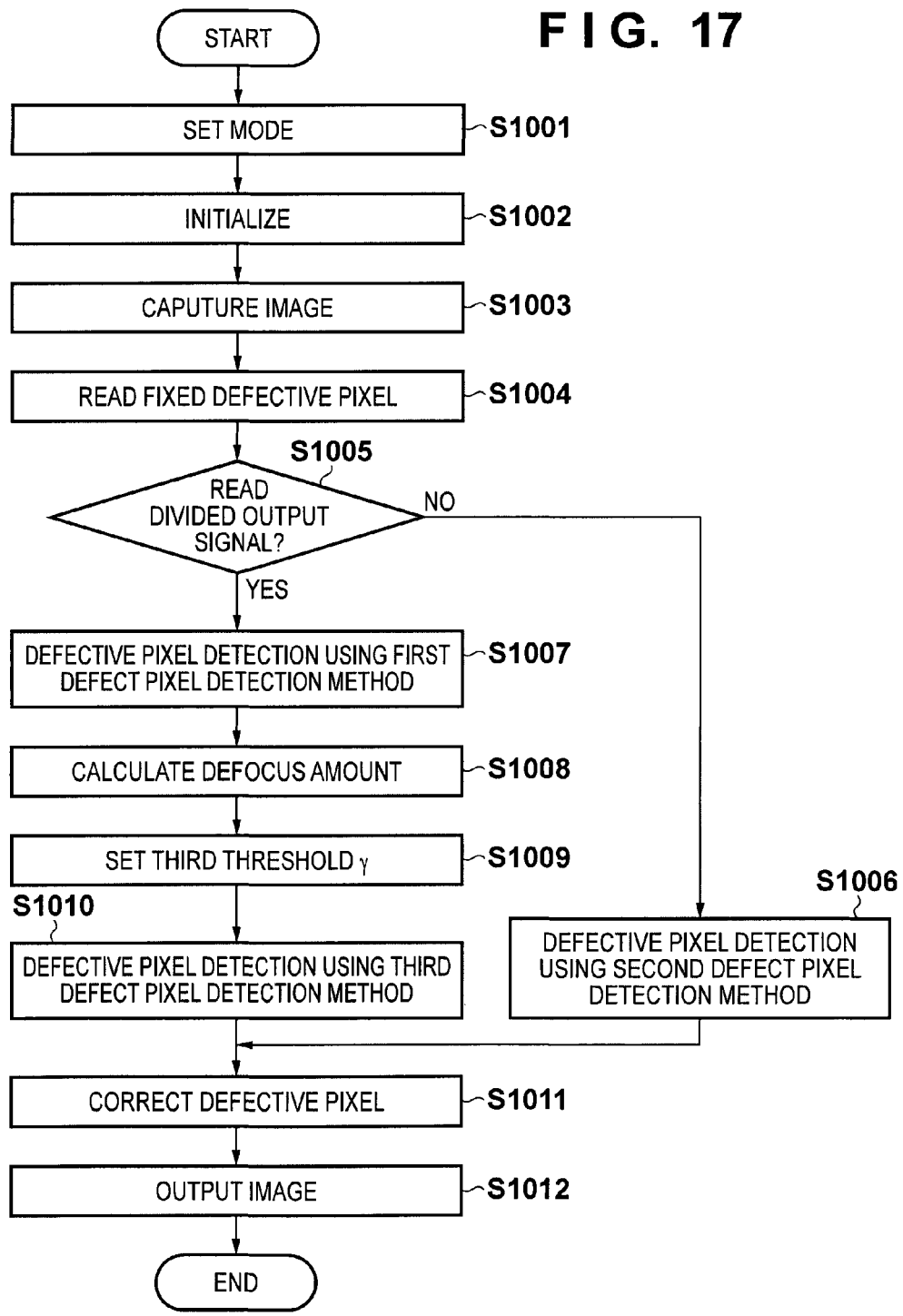
FIG. 17 is a flowchart showing a procedure of defective pixel correction according to the second embodiment.

FIG. 17 is a flowchart depicting an example of the defective pixel correction procedure according to the second embodiment.

Referring to FIG. 17, first, a mode such as still image capturing, moving image capturing, stereoscopic image capturing, or focus detection image capturing is set by the image capturing mode setting circuit 127 (step S1001), and shooting conditions such as sensitivity, a diaphragm value, and exposure time are initialized according to the set mode (step S1002). Subsequently the shutter 102 is controlled to expose the image sensor 103 (step S1003).

Next, information on fixed defective pixels extracted in advance in the manufacturing process of the image capturing apparatus is read in from the nonvolatile memory 123 (step S1004). After that, the defective pixel detection for a captured image is performed by the digital signal processing circuit 113. First, the image capturing mode set in step S1001 is checked. Then it is determined whether the checked mode is a mode where the divided output signals are individually read out according to the first drive timing described with reference to FIG. 12, or a mode where pixel output signals are read out according to the second drive timing described with reference to FIG. 13 (step S1005).

If the set mode is one where pixel signals are read out such as normal image capturing of still image or moving image, the defective pixel detection using the second defective pixel detection method described with reference to FIG. 15 is performed (step S1006).

Meanwhile, if the set mode is one where photoelectric conversion units are individually read out such as stereoscopic image capturing or focus detection image capturing, the defective pixel detection using the first defective pixel detection method described with reference to FIG. 14 is performed (step S1007). Subsequently, the defective pixel detection using the third defective pixel detection method described with reference to FIG. 16 is performed. First, a defocus amount in each of predetermined areas in a screen is calculated from a read image signal (step S1008), and based on the calculation result a third flaw detection threshold γ is set for each pixel (step S1009). Then the defective pixel detection using the third defective pixel detection method is performed with the threshold γ (step S1010).

In the second embodiment, a pixel determined to be a defective pixel with at least either the first defective pixel detection method or the third defective pixel detection method is a subject for correction in the next step. However, depending on the shooting conditions or the mode, only the pixel determined to be a defective pixel with both the first and third defective pixel detection methods may be the subject for correction.

After the defective pixel detection process according to the first and third defective pixel detection methods or the second defective pixel detection method of steps S1006 to S1010, each defective pixel is subjected to corrections by the digital signal processing circuit 113 (step S1011).

Lastly, an image signal is output to the image memory 117, the recording circuit 119, or the display circuit 121 (step S1012), and the image capturing is finished.

As described above, according to the second embodiment, the accuracy of defective pixel detection can be improved in an image capturing apparatus using an image sensor having a plurality of photoelectric conversion units.

The image capturing apparatus according to the second embodiment has been described with reference to FIGS. 9 to 17, but the present invention is not limited thereto and various other modes are available.

For example, in the pixel configuration according to the second embodiment described with reference to FIGS. 10 and 14 to 16, each pixel is formed with four photoelectric conversion units in a 2×2 arrangement for the purpose of describing the defective pixel detection method in an understandable manner. However, the present invention is not limited thereto, and the photoelectric conversion unit may be divided into two and simply arranged vertically or horizontally, or into nine arranged 3 by 3.

In the flowchart of the second embodiment described with reference to FIG. 17, defective pixels are detected with the combination of the detection results of fixed defective pixels and the three types of real-time defective pixel detection method. However, the present invention is not limited thereto, and defective pixels may be detected at least with the first defective pixel detection method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-066553, filed on Mar. 24, 2011 and No. 2012-012436, filed on Jan. 24, 2012, which are hereby incorporated by reference herein in their entirety.

The invention claimed is:

1. An image capturing apparatus comprising:
an image sensor including a plurality of pixels each having a microlens and a plurality of photoelectric conversion units that share the microlens;
a first defective pixel detection unit configured to detect a defective photoelectric conversion unit from among the plurality of photoelectric conversion units; and
a second defective pixel detection unit configured to detect a defective pixel from among the plurality of pixels,
wherein the first defective pixel detection method in which each of the plurality of photoelectric conversion units is sequentially taken as a subject for detection, and whether or not the photoelectric conversion unit of the subject for detection has a defect is determined,
wherein in the first defective pixel detection method, the first defective pixel detection unit compares an output signal that is output from the photoelectric conversion unit of the subject for detection with first signals, and
wherein the first signals are output from photoelectric conversion units included in pixels peripheral to the pixel including the photoelectric conversion unit of the subject for detection, each position of each of the photoelectric conversion units included in the peripheral pixels corresponding to a position of the photoelectric conversion unit of the subject for detection with respect to the microlens, wherein the second defective pixel detection unit determines defective pixels using a second defective pixel detection method in which each of the plurality of pixels is sequentially taken as a subject for detection and whether or not the pixel of the subject for detection has a defect is determined, and wherein in the second defective pixel detection method, the second defective pixel detection unit compares a sum of output signals from the plurality of photoelectric conversion units included in the pixel of the subject for detection with a sum of output signals from the plurality of photoelectric conversion units included in pixels peripheral to the pixel of the subject for detection.

2. The image capturing apparatus according to claim 1, wherein the image sensor further comprises a plurality of color filters with different hues, respectively provided to the pixels.

3. The image capturing apparatus according to claim 2, wherein the first defective pixel detection unit uses, for the comparison in the first defective pixel detection method, the first signals from the photoelectric conversion units included in the peripheral pixels having the color filter of the same color as the pixel that includes the photoelectric conversion unit of the subject for detection.

4. The image capturing apparatus according to claim 1, wherein the image sensor comprises a plurality of color filters of different hues, respectively provided to the pixels, and the second defective pixel detection unit uses, for the comparison in the second defective pixel detection method, output signals from the plurality of photoelectric conversion units included in the peripheral pixels having the color filter of the same color as the pixel of the subject for detection.

5. The image capturing apparatus according to claim 1, wherein each of the plurality of pixels has first photoelectric conversion unit and second photoelectric conversion unit, the image capturing apparatus further comprising:

a control unit configured to control such that a signal from the first photoelectric conversion unit in each pixel is read out, and also an output signal for each pixel is read out by adding signals from the first photoelectric conversion unit and the second photoelectric conversion unit; and a generating unit configured to generate, for each of the plurality of pixels, an output signal from the second photoelectric conversion unit by subtracting the output signal read out from the first photoelectric conversion unit from the output signal read out from each pixel, wherein the first defective pixel detection unit determines whether or not the first photoelectric conversion unit of the subject for detection has a defect by using the output signal from the first photoelectric conversion unit read out under the control of the control unit and determines whether or not the second photoelectric conversion unit of the subject for detection has a defect by using the generated signal by the generating unit.

6. The image capturing apparatus according to claim 1, wherein the first defective pixel detection unit determines with the first defective pixel detection method that the photoelectric conversion unit of the subject for detection has a defect if a difference between the output signal from the photoelectric conversion unit of the subject for detection and an average value of the first signals is larger than a predetermined first threshold.

7. The image capturing apparatus according to claim 1, wherein the second defective pixel detection unit determines with the second defective pixel detection method that the pixel of the subject for detection has a defect if a difference between a sum of output signals from the plurality of photoelectric conversion units included in the pixel of the subject for detection and an average value of sums of output signals from the pixels peripheral to the pixel of the subject for detection is larger than a predetermined second threshold.

8. The image capturing apparatus according to claim 1, further comprising a third defective pixel detection unit configured to detect a defect photoelectric conversion unit from among the plurality of photoelectric conversion units, wherein the third defective pixel detection unit determines defective pixels using a third defective pixel detection method in which whether or not the photoelectric conversion unit has a defect is determined, and wherein in the third defective pixel detection method, the third defective pixel detection unit compares the output signal from the photoelectric conversion unit of the subject for detection with output signals from other photoelectric conversion unit in the pixel that includes the photoelectric conversion unit of the subject for detection.

9. The image capturing apparatus according to claim 8, wherein the third defective pixel detection unit determines with the third defective pixel detection method that the photoelectric conversion unit of the subject for detection has a defect if a difference between the output signal from the photoelectric conversion unit of the subject for detection and an average value of the output signal from other photoelectric conversion unit in the pixel that includes the photoelectric conversion unit of the subject for detection is larger than a predetermined third threshold.

10. The image capturing apparatus according to claim 9 further comprising a defocus amount detecting unit configured to detect a defocus amount, wherein the third defective pixel detection unit changes the third threshold according to the defocus amount in an area including the pixel that includes the photoelectric conversion unit of the subject for detection.

11. The image capturing apparatus according to claim 10, wherein the third defective pixel detection unit sets the third threshold to a smaller value as the defocus amount is smaller.

12. The image capturing apparatus according to claim 10, wherein the third defective pixel detection unit sets the third threshold to a predetermined value larger than the first threshold if the defocus amount is larger than a specific value, and sets the third threshold to another predetermined value smaller than the first threshold if the defocus amount is not larger than the specific value.

13. The image capturing apparatus according to claim 8 further comprising a driving unit configured to drive the image sensor using either a first reading method in which output signals output from the plurality of photoelectric conversion units are individually read out, or a second reading method in which the output signals output from the plurality of photoelectric conversion units are added in each pixel and the thus added output is read out, wherein if the output signals are read out with the first reading method, the first defective pixel detection unit is used and if the output signals are read out with the second reading method, the second defective pixel detection unit is used.

14. The image capturing apparatus according to claim 13 further comprising a selection unit configured to select any of image capturing modes including moving image capturing, still image capturing, focus detection image capturing, and stereoscopic image capturing, wherein the driving unit drives the image sensor using the second reading method if the moving image capturing or the still image capturing is selected, and drives the image sensor with the first reading method if the focus detection image capturing or the stereoscopic image capturing is selected.

15. A method for detecting a defective pixel in an image capturing apparatus including: an image sensor including a plurality of pixels each having a microlens and a plurality of photoelectric conversion units that share the microlens, and a defective pixel detection unit configured to detect a defective photoelectric conversion unit from among the plurality of photoelectric conversion units, the method comprising:

a first determination step of sequentially taking each of the plurality of photoelectric conversion units as a subject for detection, and determining whether or not the photoelectric conversion unit of the subject for detection has a defect by comparing an output signal output from the photoelectric conversion unit of the subject for detection with signals output from photoelectric conversion units included in peripheral pixels of the pixel having the photoelectric conversion unit of the subject for detection, each position of each of the photoelectric conversion units included in the peripheral pixels corresponding to a position of the photoelectric conversion unit of the subject for detection with respect to the microlens; and a second defective pixel detection step of sequentially taking each of the plurality of pixels as a subject for detection, and determining whether or not the pixel of the subject for detection has a defect by comparing a sum of output signals from the plurality of photoelectric conversion units included in the pixel of the subject for detection with a sum of output signals from the plurality of photoelectric conversion units included in pixels peripheral to the pixel of the subject for detection.

* * * * *